(12) United States Patent
Li et al.

(10) Patent No.: US 11,915,657 B2
(45) Date of Patent: Feb. 27, 2024

(54) DISPLAY PANEL AND DISPLAY DEVICE

(71) Applicants: WUHAN TIANMA MICROELECTRONICS CO., LTD., Wuhan (CN); Wuhan Tianma Microelectronics Co., Ltd. Shanghai Branch, Shanghai (CN)

(72) Inventors: Yue Li, Wuhan (CN); Peng Zhang, Wuhan (CN); Mengmeng Zhang, Wuhan (CN); Gaojun Huang, Shanghai (CN)

(73) Assignees: WUHAN TIANMA MICROELECTRONICS CO., LTD., Wuhan (CN); Wuhan Tianma Microelectronics Co., Ltd. Shanghai Branch, Shanghai (CN)

( * ) Notice: Subject to any disclaimer, the term of this patent is extended or adjusted under 35 U.S.C. 154(b) by 0 days.

(21) Appl. No.: 18/047,361

(22) Filed: Oct. 18, 2022

(65) Prior Publication Data
US 2023/0065254 A1    Mar. 2, 2023

(30) Foreign Application Priority Data
Jun. 22, 2022  (CN) .......................... 202210712138.9

(51) Int. Cl.
*G11C 19/28*    (2006.01)
*G09G 3/3266*    (2016.01)
(Continued)

(52) U.S. Cl.
CPC .......... *G09G 3/3266* (2013.01); *G11C 19/28* (2013.01); *G09G 3/035* (2020.08); *G09G 3/3225* (2013.01);
(Continued)

(58) Field of Classification Search
CPC .. G11C 19/28; G11C 5/06; G11C 7/04; G09G 3/3266; G09G 3/3225;
(Continued)

(56) References Cited

U.S. PATENT DOCUMENTS

2013/0113688 A1*    5/2013    Choi .................... G09G 3/3266
                                                                         345/76
2017/0249916 A1*    8/2017    Jen ....................... G09G 3/3677
(Continued)

FOREIGN PATENT DOCUMENTS

CN    111554693 A  *  8/2020    ....... G02F 1/136227
CN    111554693 A       8/2020

*Primary Examiner* — Adam J Snyder
(74) *Attorney, Agent, or Firm* — CHRISTENSEN O'CONNOR JOHNSON KINDNESS PLLC

(57) ABSTRACT

A display panel and a display device are provided. In an embodiment, the display panel has a display region and a non-display region and includes shift registers cascaded and arranged along a first direction. In an embodiment, the shift registers are located in the non-display region. In an embodiment, one of the shift registers includes a switch module and an output module. In an embodiment, the output module is coupled to an output terminal of the shift register and includes two output transistors, and the output transistors are located at a side of the switch module away from the display region. In this way, the probability of occurrence of abnormal phenomena, such as splash screen display, is reduced.

24 Claims, 14 Drawing Sheets

(51) Int. Cl.
   *G09G 3/3225* (2016.01)
   *G11C 5/06* (2006.01)
   *G11C 7/04* (2006.01)
   *G09G 3/3233* (2016.01)
   *G09G 3/00* (2006.01)

(52) U.S. Cl.
   CPC ... *G09G 3/3233* (2013.01); *G09G 2300/0819* (2013.01); *G09G 2300/0842* (2013.01); *G09G 2300/0861* (2013.01); *G09G 2310/0286* (2013.01); *G09G 2320/0233* (2013.01); *G09G 2320/0238* (2013.01); *G09G 2320/0247* (2013.01); *G09G 2320/041* (2013.01); *G09G 2380/02* (2013.01); *G11C 5/06* (2013.01); *G11C 7/04* (2013.01)

(58) Field of Classification Search
   CPC ... G09G 2310/0286; G09G 2320/0233; G09G 2320/0247; G09G 3/035; G09G 3/3233; G09G 2300/0819; G09G 2300/0842; G09G 2300/0861; G09G 2320/0238; G09G 2320/041; G09G 2380/02
   See application file for complete search history.

(56) References Cited

U.S. PATENT DOCUMENTS

| | | | |
|---|---|---|---|
| 2019/0197962 A1* | 6/2019 | Moon | G09G 3/3266 |
| 2020/0052005 A1* | 2/2020 | Yoshida | H01L 21/768 |
| 2021/0043134 A1* | 2/2021 | Cho | G09G 3/3208 |

* cited by examiner

DISPLAY PANEL AND DISPLAY DEVICE

CROSS-REFERENCE TO RELATED APPLICATION

The present application claims to the benefit of Chinese Patent Application No. 202210712138.9, filed on Jun. 22, 2022, the content of which is incorporated herein by reference in its entirety.

TECHNICAL FIELD

The present disclosure relates to the field of display technologies, and in particular, to a display panel and a display device.

BACKGROUND

Due to the advantages of self-luminescence, high brightness, low power consumption, fast response, and the ability to achieve flexible display, the organic light-emitting diode (OLED) can meet the new demands of consumers for display technology, and is applied in the current mainstream display products. An abnormal display phenomenon, such as splash screen, occurs during operation of the display product in the related art.

SUMMARY

A first aspect of the present disclosure provides a display panel. In an embodiment, the display panel has a display region and a non-display region and includes shift registers cascaded and arranged along a first direction and located in the non-display region. In an embodiment, one of the shift registers includes a switch module and an output module, the output module is coupled to an output terminal of the shift register and includes two output transistors, and the two output transistors are located at a side of the switch module away from the display region.

A second aspect of the present disclosure provides a display device. In an embodiment, the display device includes a display panel. In an embodiment, the display panel has a display region and a non-display region and includes shift registers cascaded and arranged along a first direction and located in the non-display region. In an embodiment, the of the shift registers includes a switch module and an output module, the output module is coupled to an output terminal of the shift register and includes two output transistors, and the two output transistors are located at a side of the switch module away from the display region.

BRIEF DESCRIPTION OF DRAWINGS

In order to better illustrate technical solutions of embodiments of the present disclosure, the accompanying drawings used in embodiments are briefly described below. The drawings described below merely illustrate some embodiments of the present disclosure. Based on these drawings, those skilled in the art can obtain other drawings.

DESCRIPTION OF EMBODIMENTS

Figure 1:
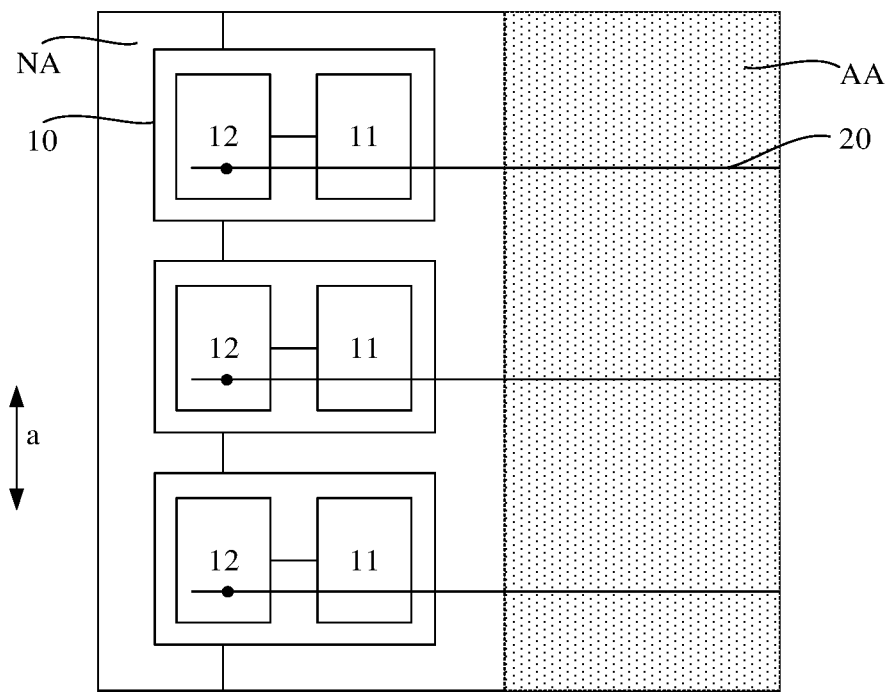
FIG. 1 is a partial simplified schematic diagram of a display panel according to some embodiments of the present disclosure.

In order to better illustrate the technical solutions of the present disclosure, some embodiments of the present disclosure are described in detail below with reference to the accompanying drawings. The described embodiments are only some, rather than all of the embodiments of the present disclosure. Based on the embodiments in the present disclosure, all other embodiments obtained by those of ordinary skill in the art shall fall within a scope of the present disclosure.

The terms used in some embodiments of the present disclosure are used only for the purpose of describing specific embodiments, and are not intended to limit the present disclosure. As used in some embodiments of the present disclosure and the appended claims, the singular forms "a/an", "the" and "said" are also intended to include the plural forms as well, unless the context clearly dictates otherwise.

As the requirement for pixels per inch (PPI, i.e., the pixel density unit) and brightness of display products is getting higher and higher, a driving current required to be provided by the driving transistor in the pixel circuit in the display region increases, and the resistance in the circuit increases, as a result, a heating efficiency in the display region increases and the display product has an overheating problem during the operation. When the display panel is in operates under a high temperature environment for a long time, the probability of occurrence of phenomenon such as splash screen display increases.

The inventor analyzes the reasons for the splash screen display. It is believed that when the display panel is in operation under a high temperature, the high temperature will cause a threshold voltage of the transistor to increase, thereby causing the threshold voltage of the transistor close to the display region to increase, thus affecting the normal operation of the circuit close to the display region. In the related art, a pixel circuit is provided in the display region of the display panel, and a scanning driving circuit and a light-emitting control circuit are provided in the non-display region. Each of the scanning driving circuit and the light-emitting control circuit includes a shift register including a transistor. The high temperature causes the threshold voltage of the transistor to increase, therefore, the threshold voltage of an output transistor in the shift register close to the display region increases. The increase of the threshold voltage of the output transistor will cause the shift register to output an abnormal signal, which leads to a splash screen display phenomenon.

In order to solve the problems in the related art, some embodiments of the present disclosure provide a display panel, in which a distance between the display region and the output transistor in the shift register is increased, so as to reduce the effect of the high temperature operating environment for the display region on the characteristics of the output transistor, and to reduce the probability of splash screen display.

FIG. 1 is a partial simplified schematic diagram of a display panel according to some embodiments of the present disclosure. As shown in FIG. 1, the display panel has a display region AA and a non-display region NA and includes multiple shift registers 10 cascaded along a first direction a. The multiple shift registers 10 are located in the non-display region NA. The shift register 10 includes a switch module 11 and an output module 12. The output module 12 is coupled to an output terminal of the shift register 10. A scanning signal line 20 located in the display region AA is coupled to the output terminal of the shift register 10. The output module 12 is configured to output a signal to the scanning signal line 20 under control of the switch module 11. The output module 12 includes two output transistors, and is located at a side of the switch module 11 away from the display region AA, that is, the output transistors are located at the side of the switch module 11 away from the display region AA. That is, the switch module 11 is located at a side of the output module 12 close to the display region AA. In FIG. 1, the switch module 11 and the output module 12 are merely shown as blocks, and their positions with respect to the display region AA are shown, but the transistor in each module is not shown. The designs according to the embodiments of the present disclosure can be applied to any shift register 10 capable of implementing a signal shift function. The structures of the switch module 11 and the output module 12 will be described in the following embodiments.

In some embodiment of the present disclosure, the positions of the output module 12 and the switch module 11 in the shift register 10 with respect to the display region AA are designed, and the output transistor in the output module 12 is arranged at a side of the switch module 11 away from the display region AA, thereby increasing the distance between the output transistor and the display region AA and thus reducing the effect of the high temperature operating environment for the display region AA on the threshold voltage of the output transistor. In this way, the performance reliability of the shift register 10 is improved, and it can avoid that the shift register 10 outputs an abnormal signal to the display region AA due to an increase of the threshold voltage of the output transistor during display operation, thereby reducing the probability of abnormal phenomena such as splash screen display.

Figure 2:
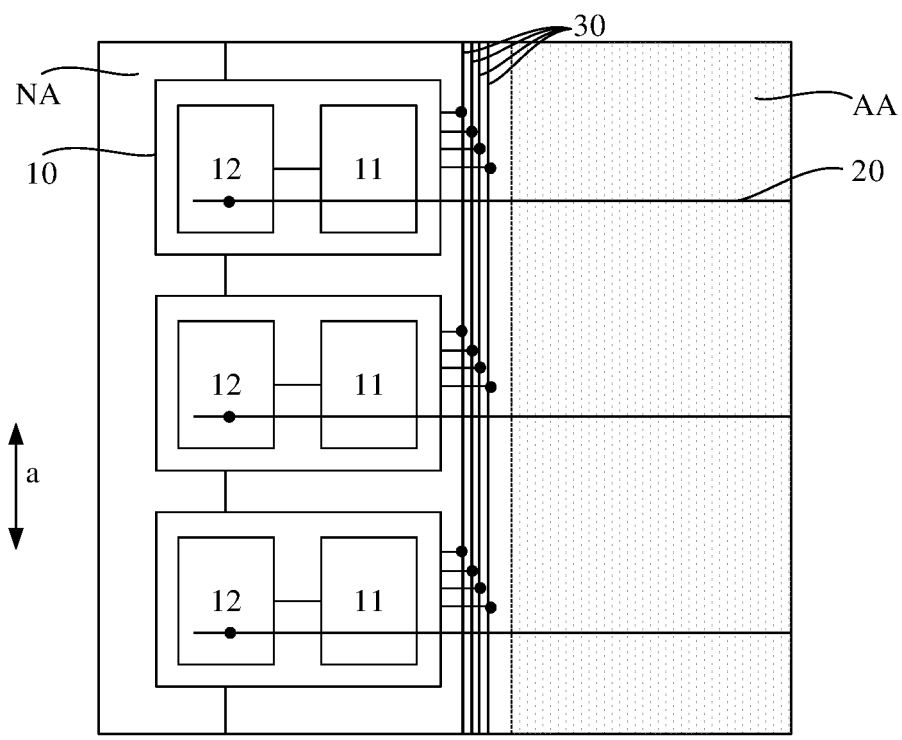
FIG. 2 is another partial simplified schematic diagram of a display panel according to some embodiments of the present disclosure.

FIG. 2 is another partial simplified schematic diagram of a display panel according to some embodiments of the present disclosure. In some embodiments, as shown in FIG. 2, the display panel includes multiple driving signal lines 30 located in the non-display region NA and each extending along the first direction a, the shift register 10 is coupled to the driving signal line 30, and the driving signal line 30 is configured to drive the shift register 10 to operate. At least one driving signal line 30 is located between the shift register 10 and the display region AA. The number of the driving signal lines 30 shown in FIG. 2 is only illustrative but not limited in the present disclosure. In the shift register 10, the switch module 11 is configured to control the operating state of the output module 12, and the switch module 11 needs coupled to at least part of the driving signal lines 30. In the embodiments of the present disclosure, the switch module 11 is arranged at a side of the output module 12 close to the display region AA, and at least one driving signal line 30 is arranged between the shift register 10 and the display region AA. The position of at least part of the driving signal lines 30 can be reasonably designed according to the position of the switch module 11, and a length of the wire connecting the switch module 11 and the driving signal line 30 can be reduced, thereby saving a space of the non-display region NA. Meanwhile, the distance between the display region AA and each of the two output transistors can be increased, thereby reducing the effect of the high temperature operating environment for the display region AA on the threshold voltage of the output transistor, thus reducing the probability of abnormal phenomena, such as splash screen display.

Figure 3:
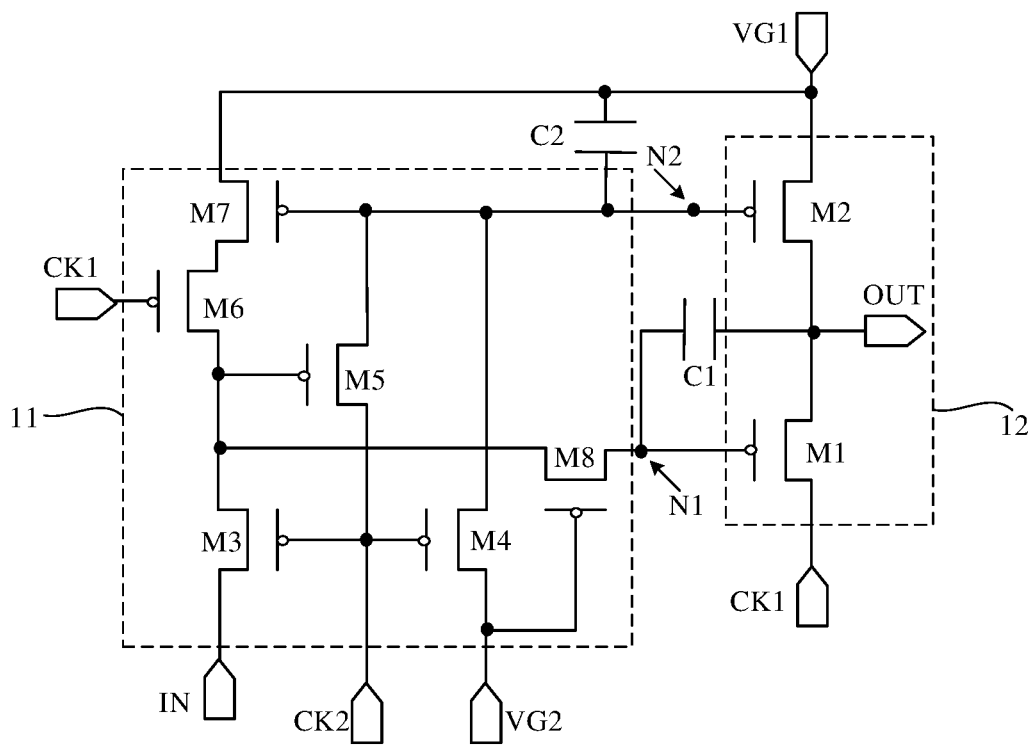
FIG. 3 is a schematic diagram of a shift register circuit according to some embodiments of the present disclosure.
Figure 4:
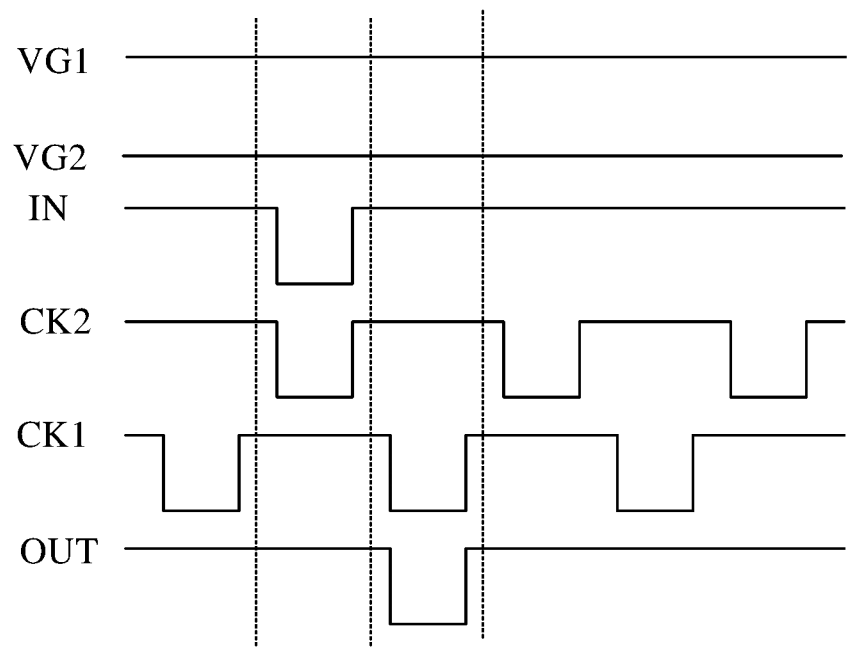
FIG. 4 is a timing sequence of a driving signal line corresponding to a shift register in the embodiments of FIG. 3 according to an embodiment of the present disclosure.

FIG. 3 is a schematic diagram of a shift register circuit according to some embodiments of the present disclosure, and FIG. 4 is a timing diagram of a driving signal line corresponding to the shift register in the embodiment of FIG. 3. In some embodiments, as shown in FIG. 3, the output module 12 is coupled to an output terminal OUT of the shift register 10 and is coupled to the switch module 11 through a first node N1 and a second node N2. The two output transistors in the output module 12 are a first output transistor M1 and a second output transistor M2, respectively. A control electrode of the first output transistor M1 is coupled to the first node N1, a first electrode of the first output transistor M1 is coupled to a first clock signal line CK1, and a second electrode of the first output transistor M1 is coupled to the output terminal OUT of the shift register 10. A control electrode of the second output transistor M2 is coupled to the second node N2, a first electrode of the second output transistor M2 is coupled to a first power supply voltage signal line VG1, and a second electrode of the second output transistor M2 is coupled to the output terminal OUT of the shift register 10.

The switch module 11 includes a third switch transistor M3, a fourth switch transistor M4, a fifth switch transistor M5, a sixth switch transistor M6, and a seventh switch transistor M7. A control electrode of the third switch transistor M3 and a control electrode of the fourth switch transistor M4 are coupled to a second clock signal line CK2, a first electrode of the third switch transistor M3 is coupled to an input terminal IN of the shift register 10, and a second electrode of the third switch transistor M3 is coupled to the first node N1. A first electrode of the fourth switch transistor M4 is coupled to a second power voltage signal line VG2, and a second electrode of the fourth switch transistor M4 is coupled to the second node N2. A control electrode of the fifth switch transistor M5 is coupled to the second electrode of the third switch transistor M3, a first electrode of the fifth switch transistor M5 is coupled to a second clock signal line CK2, and a second electrode of the fifth switch transistor M5 is coupled to the second node N2. A control electrode of the sixth switch transistor M6 is coupled to the first clock signal line CK1, a first electrode of the sixth switch transistor M6 is coupled to the control electrode of the fifth switch transistor M5, and a second electrode of the sixth switch transistor M6 is coupled to a first electrode of the switch transistor M7. A control electrode of the seventh switch transistor M7 is coupled to the second node N2, and a second electrode of the seventh switch transistor M7 is coupled to the first power supply voltage signal line VG1. In some embodiments, the switch module 11 includes an eighth switch transistor M8, a control electrode of the eighth switch transistor M8 is coupled to the second power supply voltage signal line VG2, a first electrode of the eighth switch transistor M8 is coupled to the second electrode of the third switch transistor M3, and a second electrode of the eighth switch transistor M8 is coupled to the first node N1. That is, the second electrode of the third switch transistor M3 is coupled to the first node N1 through the eighth switch transistor M8.

The shift register can include a first capacitor C1 and a second capacitor C2. A first electrode plate of the first capacitor C1 is coupled to the first node N1, and a second electrode plate of the first capacitor C1 is coupled to the output terminal OUT of the shift register 10. A first electrode plate of the second capacitor C2 is coupled to the first power supply voltage signal line VG1, and a second electrode plate of the second capacitor C2 is coupled to the second node N2.

It is shown in FIG. 3 that each transistor in the output module 12 and the switch module 11 is a p-type transistor. It can be seen from the timing sequence shown in FIG. 4 that the first power supply voltage signal line VG1 provides a high-level signal, and the second power supply voltage signal line VG2 provides a low-level signal. That is, a voltage value of the signal provided by the first power supply voltage signal line VG1 is greater than a voltage value of the signal provided by the second power supply voltage signal line VG2. In some1 embodiments, each of the first power supply voltage signal line VG1 and the second power supply voltage signal line VG2 provides a constant voltage signal. The first clock signal line CK1 and the second clock signal line CK2 transmit opposite voltage signals in at least one moment. The signal input to the input terminal IN is shifted by the shift register 10, and the output terminal OUT of the shift register 10 outputs the shifted signal.

In multiple cascaded shift registers 10, an input terminal IN of an effective first shift register 10 is connected to a start signal line, an input terminal IN of a second shift register 10 is connected to an output terminal OUT of the first shift register 10, and an input terminal IN of the third stage shift register 10 is connected to an output terminal OUT of the second stage shift register 10, and the cascade connection of the shift registers 10 is achieved in such a manner. The effective first shift register 10 refers to a shift register of the multiple cascaded shift registers 10 that firstly provides an effective signal to the scanning signal line 20 in the display region AA.

Taking the shift register 10 shown in FIG. 3 as an example, the driving signal lines 30 for driving the shift register 10 to operate include at least a start signal line, a first power supply voltage signal line VG1, a second power supply voltage signal line VG2, a first clock signal line CK1, and a second clock signal line CK2. In some embodiments of the present disclosure, at least one of the above-mentioned driving signal lines 30 is arranged between the shift register 10 and the display region AA.

Figure 5:
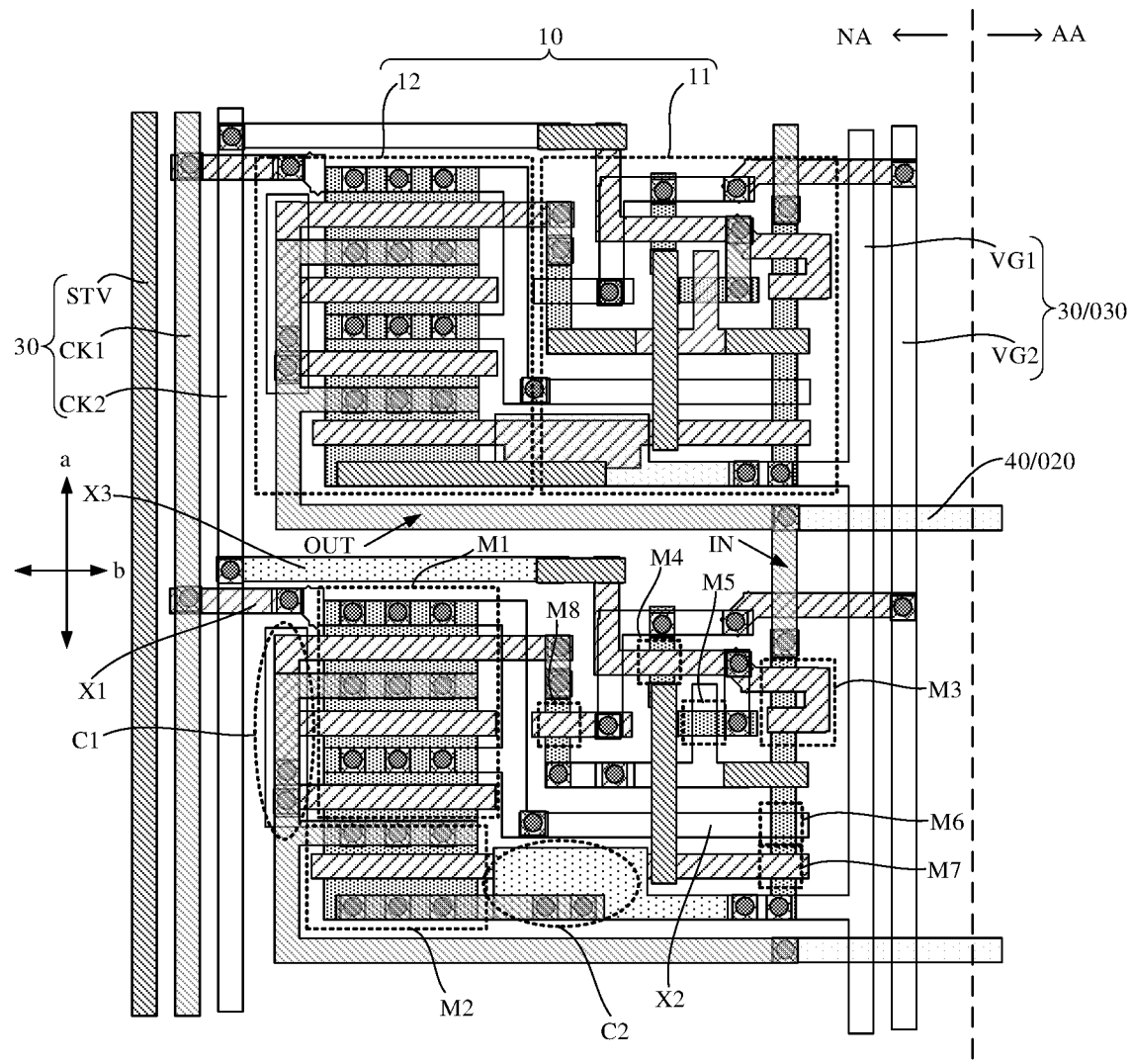
FIG. 5 is another partial schematic diagram of a display panel according to some embodiments of the present disclosure.

FIG. 5 is another partial schematic diagram of another display panel according to some embodiments of the present disclosure. In some embodiments, FIG. 5 shows the positions of two shift registers 10 that are cascaded and arranged along the first direction a. The structure of the shift register 10 shown in FIG. 5 can be understood in conjunction with the circuit diagram shown in FIG. 3. FIG. 5 shows that the third switch transistor M3 is a double-gate transistor. As shown in FIG. 5, the first power supply voltage signal line VG1 and the second power supply voltage signal line VG2 are both located between the shift register 10 and the display region AA. FIG. 5 illustrates a connection line 40, and the connection line 40 extends from the non-display region NA towards the display region AA. The connection line 40 includes an end connected to the output terminal OUT of the shift register 10, and another end connected to the scanning signal line located in the display region AA, to provide the signal of the output terminal OUT of the shift register 10 to the scanning signal line.

With reference to FIG. 3 and FIG. 5, it can be seen that, in the switch module 11, the seventh switch transistor M7 needs to be connected to the first power supply voltage signal line VG1, and the fourth switch transistor M4 and the eighth switch transistor M8 need to be connected to the second power supply voltage signal line VG2. Moreover, in the output module 12, the second output transistor M2 needs to be connected to the first power supply voltage signal line VG1. With reference to the position of teach transistor, the first power supply voltage signal line VG1 and the second power supply voltage signal line VG2 being arranged between the shift register 10 and the display region AA can shorten a length of a line connecting the transistor and the first power supply voltage signal line VG1 or a length of a line connecting the transistor and the display region AA, thereby saving a wiring space of the non-display region NA.

When at least one driving signal line 30 is located between the shift register 10 and the display region AA, the connection line 40 is insulated from and intersects with the driving signal line 30 located between the shift register 10 and the display region AA. It can be seen from FIG. 5 that the connection line 40 overlaps with the first power supply voltage signal line VG1 and the second power supply voltage signal line VG2 when extending from the non-display region NA to the display region AA. In some embodiments, each of the power supply voltage signal line VG1 and the second power supply voltage signal line VG2 transmits a corresponding constant voltage signal, and when the first power supply voltage signal line VG1 and the second power supply voltage signal line VG2 overlap with the connection line 40, an effect on a signal transmitted on the connection line 40 is small, thereby achieving the stability of the signal on the connection line 40.

It should be noted that "overlapping" here refers to that from a top view, the two metal lines having different extending directions are insulated from and intersect with each other. It can be understood that there is capacitance formed at a position where the two metal lines are insulated from and intersect with each other, and the capacitance affects the load on the metal wire, thereby affecting the voltage drop of the signal transmitted on the metal wire.

In some embodiments, for some line segments of the connection line 40, a line width is reduced. For example, the line width of the connection line 40 at a position where the connection line 40 overlaps with the driving signal line 30 is reduced, so that an overlapping area between the connection line 40 and the driving signal line 30 can be reduced, thereby reducing the capacitance generated by the overlapping and thus reducing the load on the connection line 40.

In some embodiments, as shown in FIG. 5, the first power supply voltage signal line VG1 and the second power supply voltage signal line VG2 are both located between the shift register 10 and the display region AA. In other embodiments, one of the first power supply voltage signal line VG1 and the second power supply voltage signal line VG2 is located between the shift register 10 and the display region AA, which is not shown in the drawings herein.

In some embodiments, as shown in FIG. 5, at least one driving signal line 30 is located at a side of the shift register 10 close to the display region AA, and at least one driving signal line 30 is located at a side of the shift register 10 away from the display region AA. That is, the driving signal lines 30 are respectively arranged at both sides of the shift register 10 along a second direction b, and the second direction b intersects with the first direction a. In this case, the driving signal line 30 located at the side of the shift register 10 close to the display region AA can increase the distance between the output transistor and the display region AA, thereby reducing the effect of the high temperature operating environment for the display region AA on the threshold voltage of the output transistor, thus reducing the probability of abnormal phenomena, such as splash screen display. Meanwhile, at least one driving signal line 30 is arranged at the side of the shift register 10 away from the display region AA, so the connection line 40 does not need to overlap with all driving signal lines 30 when the connection line 40 extends towards the display region AA, thereby reducing the number of connection lines that overlap with the driving signal lines 30, thus reducing the load on the connection lines 40 and also reducing the voltage drop of transmission signals on the connection lines 40.

In some embodiments, as shown in FIG. 5, the first clock signal line CK1 and the second clock signal line CK2 are arranged at a side of the shift register 10 away from the display region AA. It can be seen from FIG. 5 that the first electrode of the first output transistor M1 is connected to the first clock signal line CK1 through a first line segment X1 extending along the second direction b, and the control electrode of the sixth switch transistor M6 is connected to the first electrode of the first output transistor M1 through a second line segment X2, so that the control electrode of the sixth switch transistor M6 is connected to the first clock signal line CK1. In addition, each of the control electrode of the third switch transistor M3 and the control electrode of the fourth switch transistor M4 is connected to the second clock signal line CK2 through a third line segment X3 extending in the second direction b. The first line segment X1 and the third line segment X3 are equivalent to pulling lines from the shift register 10 along a direction away from the display region AA, to be connected to the corresponding clock signal lines, but the first line segment X1 and the third line segment X3 are also substantially straight line segments, which occupy a small space of the non-display region NA. A periodic voltage signal is transmitted on each of the first clock signal line CK1 and the second clock signal line CK2. When the connection line 40 overlaps with the clock signal line, the voltage jump on the clock signal line may have a certain effect on the signal on the connection line 40. The connection line 40 needs to be coupled to the scanning signal line 20 in the display region AA, and the scanning signal line 20 is coupled to the pixel circuit. If the signal on the connection line 40 fluctuates greatly, the operation of the pixel circuit will be affected, causing the driving transistor in the pixel circuit to generate a leakage current, thereby affecting the display uniformity. In the embodiments of the present disclosure, the first clock signal line CK1 and the second clock signal line CK2 are arranged at a side of the shift register 10 away from the display region AA, which can not only reduce the number of driving signal lines 30 overlapping with the connection lines 40 to reduce the load on the connection lines 40, but also eliminate the possible effect of the voltage jump on the clock signal line on the signal on the connection line 40, thereby ensuring the stability of the transmission signal transmitted on the connection line 40 and improving the display uniformity.

In other embodiments, one of the first clock signal line CK1 and the second clock signal line CK2 is located at a side of the shift register 10 away from the display region AA, and the other one of the first clock signal line CK1 and the second clock signal line CK2 is located at a side of the shift register 10 close to the display region AA. That is, the two clock signal lines are disposed at both sides of the shift register 10 along the second direction b, respectively. The clock signal line located at the side of the shift register 10 close to the display region AA can increase the distance between the output transistor and the display region AA, thereby reducing the risk of splash screen display. The clock signal line located at the side of the shift register 10 away from the display region AA can reduce the number of driving signal lines 30 overlapping with the connection line 40, thereby reducing the load on the connection lines 40, and thus ensuring the stability of the transmission signal on the connection line 40.

In some embodiments, as shown in FIG. 5, the start signal line STV is located at a side of the shift register 10 away from the display region AA. Among multiple shift registers 10 that are cascaded, only the input terminal IN of the effective first shift register 10 is connected to a start signal line STY. That is, only the effective first shift register 10 leads out a metal line to be connected to the start signal line STY. The start signal line STV is arranged at a side of the shift register 10 away from the display region AA, thereby having less effect on the wiring space of the non-display region NA, and reducing the number of driving signal lines 30 overlapping with the connection lines 40 and reducing the load on the connection lines 40, thus ensuring the stability of the signal transmitted on the connection line 40.

Figure 6:
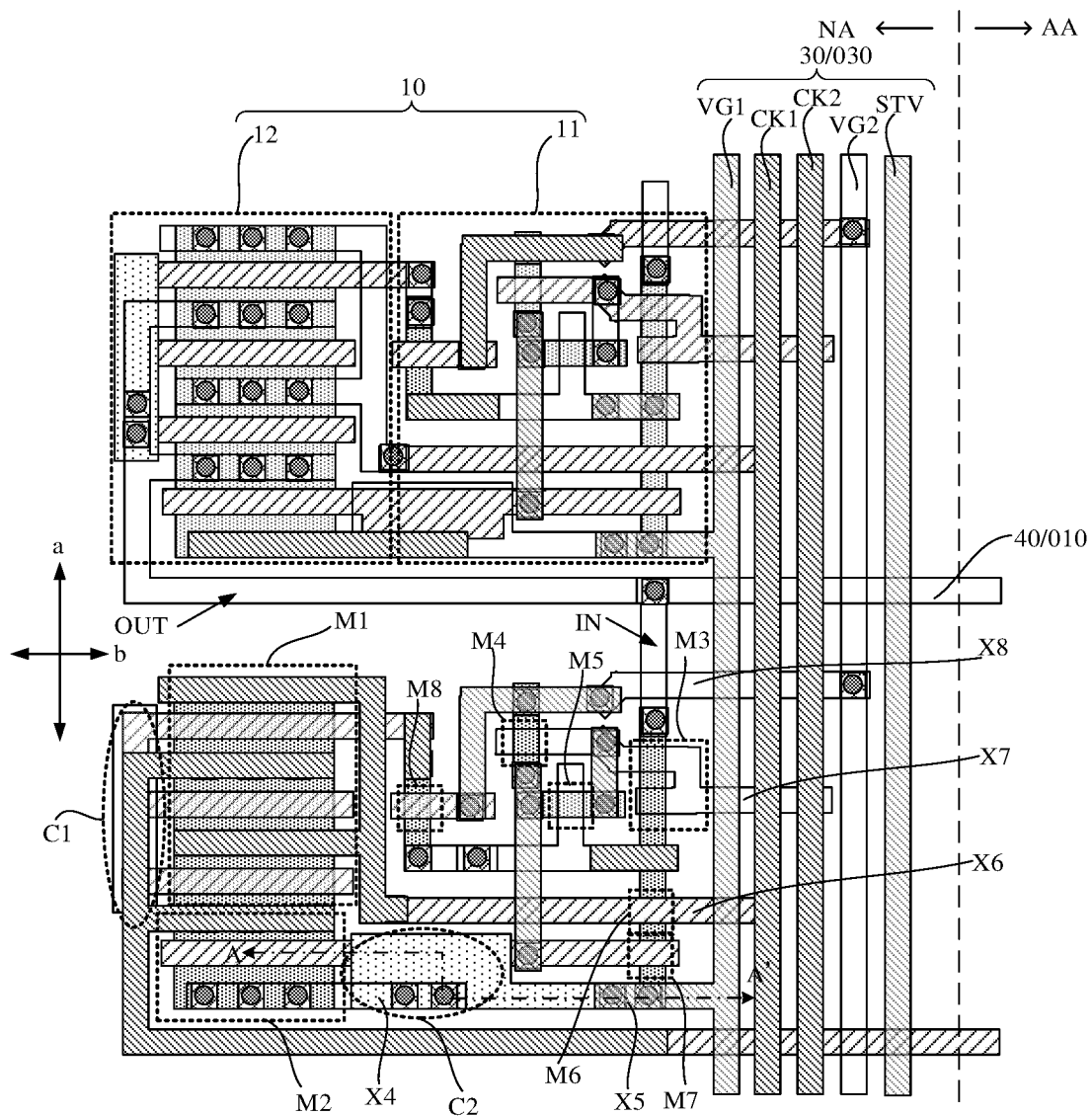
FIG. 6 is another partial schematic diagram of a display panel according to some embodiments of the present disclosure.

FIG. 6 is another partial schematic diagram of a display panel according to some embodiments of the present disclosure. In some embodiments, FIG. 6 illustrates the positions of two shift registers 10 cascaded and arranged along the first direction a. As shown in FIG. 6, the first power supply voltage signal line VG1 and the second power supply voltage signal line VG2 are located between the shift register 10 and the display region AA, and the first clock signal line CK1 and the second clock signal line CK2 are located between the shift register 10 and the display region AA. It can be seen that the shift register 10 can be connected to the corresponding first power supply voltage signal line VG1, second power supply voltage signal line VG2, first clock signal line CK1, and second clock signal line CK2 only by pulling a wire towards the display region AA along the second direction b, without increasing the length of the wire, and such configuration can save the wiring space in the non-display region NA. In this way, the distance between the display region AA and each of the two output transistors can be increased, thereby reducing an effect of the high temperature operating environment for the display region AA on the threshold voltage of the output transistor, thus reducing the probability of abnormal phenomena, such as splash screen display.

In some embodiments, the start signal line STV as shown in FIG. 6 is located between the shift register 10 and the display region AA. In the embodiment of the present disclosure, the output module 12 is located at a side of the switch module 11 away from the display region AA, and then the input terminal IN of the shift register 10 is located at a side of the output module 12 close to the display region AA. From FIG. 6, it can understand the position of the input terminal IN of the first shift register 10, and the start signal line STV being arranged between the shift register 10 and the display region AA can shorten a length of the line connecting the input terminal IN of the first shift register 10 and the start signal line STV, thus being beneficial to save the wiring space of the non-display region NA.

In other embodiments, the first power supply voltage signal line VG1, the second power supply voltage signal line VG2, the first clock signal line CK1, and the second clock signal line CK2 are located between the shift register 10 and the display region AA, and the start signal line STV is located at a side of the shift register 10 away from the display region AA, which is not shown in the drawings herein.

Figure 7:
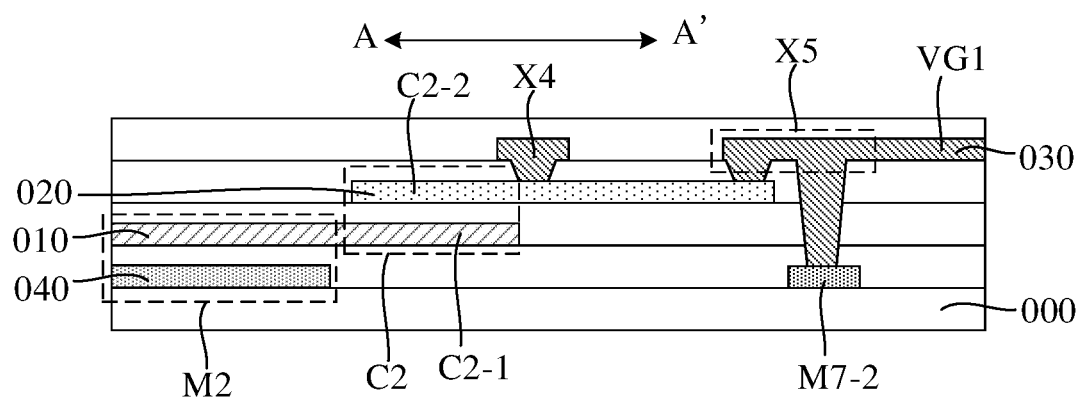
FIG. 7 is a cross-sectional view along A-A' shown in FIG. 6 according to an embodiment of the present disclosure.

FIG. 7 is a cross-sectional view along A-A' shown in in FIG. 6. In some embodiments, as shown in FIG. 7, the display panel includes a substrate 000, a first metal layer 010, a second metal layer 020, and a third metal layer 030. The first metal layer 010, the second metal layer 020, and the third metal layer 030 are sequentially arrange on the substrate 000 along a direction away from the substrate 000. A semiconductor layer 040 is provided between the substrate 000 and the first metal layer 010. An insulating layer is provided between adjacent metal layers, and an insulating layer is provided between the metal layer and the semiconductor layer. The active layer of each transistor is located in the semiconductor layer 040, and the control electrode (i.e., the gate) of each transistor is located in the first metal layer 010. The second output transistor M2 is shown in FIG. 7, and it can be seen that the active layer of the second output transistor M2 is located in the semiconductor layer 040, and the gate of the second output transistor M2 is located in the first metal layer 010. The first electrode plate C2-1 of the second capacitor C2 is located in the first metal layer 010, the second electrode plate C2-2 of the second capacitor C2 is located in the second metal layer 020, and the first electrode plate C2-1 is connected to the gate of the second output transistor M2. A fourth line segment X4 is a wire connecting the second electrode of the second output transistor M2 and the second electrode plate C2-2, and the fourth line segment X4 is located in the third metal layer 030 and passes through a through-hole penetrating through the insulating layer to be connected to the second electrode plate C2-2. FIG. 7 also illustrates the second electrode M7-2 of the seventh switch transistor, and the second electrode M7-1 of the seventh switch transistor is connected to the second electrode plate C2-2 of the second capacitor C2 through a fifth line segment X5. The second electrode M7-2 of the seventh switch transistor and the second electrode plate C2-2 are both connected to the first power supply voltage signal line VG1. The fifth line segment X5 and the first power supply voltage signal line VG1 are both located in the third metal layer 030. The fifth line segment X5 is connected to the second electrode plate C2-2 through a through-hole penetrating through the insulating layer, and the fifth line segment X5 is connected to the second electrode M7-2 of the seventh switch transistor through a through-hole penetrating through the insulating layer.

In the drawings of the embodiments of the present disclosure, the structures with a same filling pattern are located in a same layer, and the layer of each structure in the shift register 10 shown in the FIG. 5 or FIG. 6 can be understood with reference to the embodiments sown in FIG. 7. It can be seen that in the embodiments of the present disclosure, all driving signal lines 30 are located in a same layer, and all the driving signal lines 30 are located in the third metal layer 030.

In some embodiments, as shown in FIG. 6, in the second direction b, the first clock signal line CK1 and the second clock signal line CK2 are located between the first power supply voltage signal line VG1 and the second power supply voltage signal line VG2. With reference to FIG. 7, the control electrode of the sixth switch transistor M6 is connected to the first clock signal line CK1 through a sixth line segment X6, and the control electrode of the third switch transistor M3 is connected to the second clock signal line CK2 through a seventh line segment X7, and the control electrode of the sixth switch transistor M6 and the control electrode of the third switch transistor M3 are located in a same layer which is different from a layer where the clock signal line is located. Both the sixth line segment X6 and the seventh line segment X7 being located in the first metal layer 010 is equivalent to that the control electrode of the sixth switch transistor M6 is directly pulled towards the display region AA and then connected to the first clock signal line CK1, and the control electrode of the third switch transistor M3 is directly pulled towards the display region AA and then connected to the second clock signal line CK2, thereby reducing the number of holes formed in the insulating layer. The second electrode M7-2 of the seventh switch transistor M7 and the second electrode plate C2-2 of the second capacitor C2 are both coupled to the first power supply voltage signal line VG1 through the fifth line segment X5, and the first power supply voltage signal line VG1 is arranged at a side of the clock signal line close to the shift register 10, then the fifth line segment X5 does not need to overlap with the clock signal line. In this case, the fifth line segment X5 and the first power supply voltage signal line VG1 can be arranged in a same layer, which can make the fifth line segment X5 not need to be disposed in at least two layers, and can also reduce the number of holes formed in the insulating layer.

In some embodiments, the first electrode of the fourth switch transistor M4 is coupled to the second power supply voltage signal line VG2. As shown in FIG. 6, the first electrode of the fourth switch transistor M4 is connected to the second power supply voltage signal line VG2 through an eighth line segment X8. The eighth line segment X8 intersects with a metal line of the input terminal IN of the shift register 10, and the metal line of the input terminal IN of the shift register 10 is located in the third metal layer 030, therefore, the eighth line segment X8 and the input terminal IN are located in different layers to prevent short-circuited between the eighth line segment X8 and the input terminal IN. FIG. 6 shows that the eighth line segment X8 is located in the first metal layer 010, the eighth line segment X8 extends towards the display region AA and is coupled to the second power voltage signal line VG2 through the through-hole formed in the insulating layer.

In some embodiments, as shown in FIG. 6, the start signal line STV is one of the driving signal lines 30 that is closest to the display region AA. Among the multiple shift registers 10, only the input terminal IN of the effective first shift register 10 needs to be connected to the start signal line STY. If the start signal line STV is arranged at a position close to the shift register 10, then at least one of the fifth line segment X5, the sixth line segment X6, the seventh line segment X7, or the eighth line segment X8 will overlap with the start signal line STV, which not only increases the length of the line segment, but also increases parasitic capacitance due to the overlapping. After taking the above factors into consideration, the start signal line STV is arranged as the one of the driving signal lines 30 that is closest to the display region AA, which can shorten the length of the line segment in the circuit and avoid the overlapping between the line segment and the start signal line STY.

In other embodiments, the first clock signal line CK1, the second clock signal line CK2, the first power supply voltage signal line VG1, and the second power supply voltage signal line VG2 are all located between the shift register 10 and the display region AA; and the first power supply voltage signal line VG1 and the second power supply voltage signal line VG2 are located at a side of the first clock signal line CK1 and the second clock signal line CK2 away from the display region AA, which is not shown in the drawings.

It can be seen from the FIG. 5 or FIG. 6 that the connection line 40 extends from the non-display region NA towards the display region AA. As shown in the embodiments of FIG. 5, the first power supply voltage signal line VG1 and the second power supply voltage signal line VG2 are arranged between the shift register 10 and the display region AA, the connection line 40 extends from the non-display region NA towards the display region AA, and the connection line 40 is insulated from and intersects with the first power supply voltage signal line VG1 and the second power supply voltage signal line VG2. In the embodiments shown in FIG. 6, the connection line 40 is insulated from and intersects with each of the first power supply voltage signal line VG1, the second power supply voltage signal line VG2, the first clock signal line CK1, the second clock signal line CK2, and the start signal line STY. Referring to the description of the embodiments of FIG. 7, the display panel includes a first metal layer 010, a second metal layer 020, and a third metal layer 030.

In some embodiments, as shown in FIG. 6, the driving signal line 30 is located in the third metal layer 030, and the connection line 40 is located in the first metal layer 010. Referring to FIG. 7, at least two insulating layers are arranged between the first metal layer 010 and the third metal layer 030, so a thickness of the insulating layers at a position where the connection line 40 is insulated from and intersects with the driving signal line 30 is relatively large, which can reduce the capacitance generated by the overlapping between the connection line 40 and the driving signal line 30, thereby reducing the load on the connection line 40 and improving the stability of the signal transmitted on the connection line 40.

In other embodiments, as shown in FIG. 5, the driving signal line 30 is located in the third metal layer 030, and the connection line 40 is located in the second metal layer 020. The connection line 40 is insulated from and intersects with the first power supply voltage signal line VG1 and the second power supply voltage signal line VG2. In the embodiments, the number of signal lines that are insulated from and intersect with the connection line 40 is small, and the connection line 40 can be arranged in the second metal layer 020.

Figure 8:
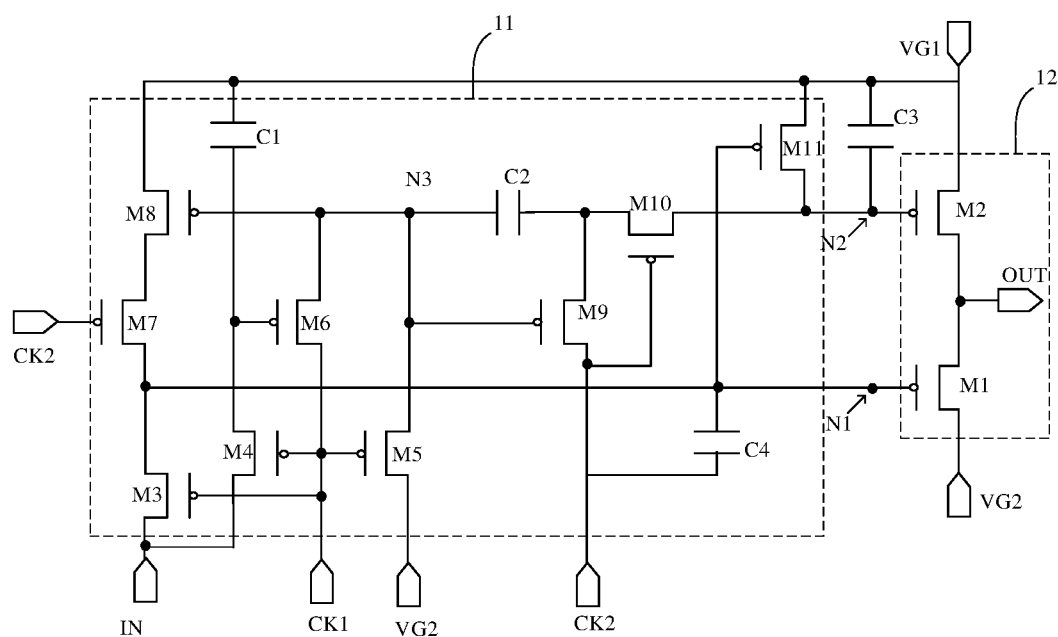
FIG. 8 is another schematic diagram of a shift register circuit according to some embodiments of the present disclosure.

FIG. 8 is another schematic diagram of a shift register circuit according to some embodiments of the present disclosure. In other embodiments, as shown in FIG. 8, the shift register includes a switch module 11 and an output module 12, and the output module 12 includes a first output transistor M1 and a second output transistor M2, the control electrode of the first output transistor M1 is coupled to the first node N1, the first electrode of the first output transistor M1 is coupled to the second power supply voltage signal line VG2, and the second electrode of the first output transistor M1 is coupled to the output terminal OUT of the shift register; the control electrode of the second output transistor M2 is coupled to the first node N1, the first electrode of the second output transistor M2 is coupled to the first power supply voltage signal line VG1, and the second electrode of the second output transistor M2 is coupled to the output terminal OUT of the shift register. In some embodiments, each of the first power supply voltage signal line VG1 and the second power supply voltage signal line VG2 provides a constant voltage signal, and a voltage value of the signal provided by the first power supply voltage signal line VG1 is greater than a voltage value of the signal provided by the second power supply voltage signal line VG2.

The switch module 11 includes nine switch transistors. The control electrode of the third switch transistor M3, the control electrode of the fourth switch transistor M4, and the control electrode of the fifth switch transistor M5 are all coupled to the first clock signal line CK1. The first electrode of the third switch transistor M3 is coupled to the input terminal IN of the shift register 10, and the second electrode of the third switch transistor M3 is coupled to the first node N1. The first electrode of the fourth switch transistor M4 is coupled to the input terminal IN of the shift register 10, and the second electrode of the fourth switch transistor M4 is coupled to the control electrode of the sixth switch transistor M6. The first electrode of the fifth switch transistor M5 is coupled to the second power supply voltage signal line VG2, and the second electrode of the fifth switch transistor M5 is coupled to the third node N3. The first electrode of the sixth switch transistor M6 is coupled to the first clock signal line CK1, and the second electrode of the sixth switch transistor M6 is coupled to the third node N3. The control electrode of the seventh switch transistor M7 is coupled to the second clock signal line CK2, the first electrode of the seventh switch transistor M7 is coupled to the second electrode of the eighth switch transistor M8, and the second electrode of the seventh switch transistor M7 is coupled the first node N1. The control electrode of the eighth switch transistor M8 is coupled to the third node N3, and the first electrode of the eighth switch transistor M8 is coupled to the first power supply voltage signal line VG1. The control electrode of the ninth switch transistor M9 is coupled to the third node N3, the first electrode of the ninth switch transistor M9 is coupled to the second clock signal line CK2, and the second electrode of the ninth switch transistor M9 is coupled to the first electrode of the tenth switch transistor M10. The control electrode of the tenth switch transistor M10 is coupled to the second clock signal line CK2, and the second electrode of the tenth switch transistor M10 is coupled to the second node N2.

As shown in FIG. 8, the shift register 10 can include a first capacitor C1, a second capacitor C2, a third capacitor C3, and a fourth capacitor C4. The first capacitor C1 includes an electrode plate coupled to the control electrode of the sixth transistor M6, and another electrode plate coupled to the first power supply voltage signal line VG1. The second capacitor C2 includes an electrode plate coupled to the third node N3, and another electrode plate coupled to the first electrode of the tenth transistor M10. The third capacitor C3 includes an electrode plate coupled to the second node N2, and another electrode plate coupled to the first power supply voltage signal line VG1. The fourth capacitor C4 includes an electrode plate coupled to the second clock signal line CK2, and another electrode plate coupled to the first node N1.

Figure 9:
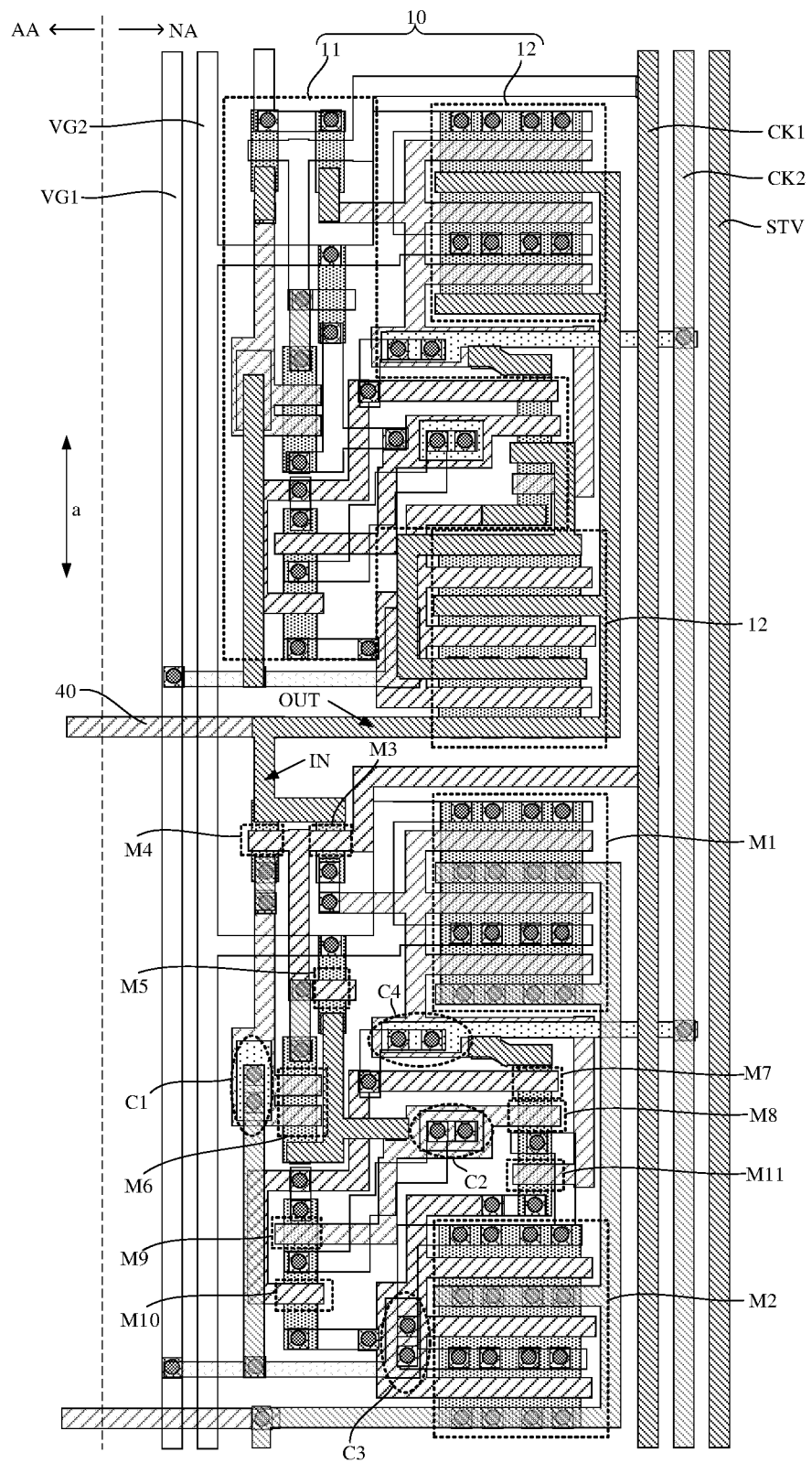
FIG. 9 is another partial schematic diagram of a display panel according to some embodiments of the present disclosure.

In some embodiments, FIG. 9 is another partial schematic diagram of a display panel according to some embodiments of the present disclosure. FIG. 9 illustrates the positions of two shift registers 10 cascaded and arranged along the first direction a. The structure of the shift register 10 shown in FIG. 9 can be understood with reference to the circuit diagram shown in FIG. 8. The embodiments of FIG. 9 can be understood with reference to the embodiments of FIG. 5. The only difference between the embodiments of FIG. 9 and the embodiments of FIG. 5 is the specific structures of the switch module 11 and the output module 12 in the shift register 10.

As shown in FIG. 9, the first power supply voltage signal line VG1 and the second power supply voltage signal line VG2 are located between the shift register 10 and the display region AA. An end of the connection line 40 is connected to the output terminal OUT of the shift register 10, the connection line 40 extends from the non-display region NA towards the display region AA, and another end of the connection line 40 is connected to the scanning signal line in the display region AA, thereby realizing that the signal output by the output terminal OUT of the shift register 10 is supplied to the scanning signal line. The power supply voltage signal line being arranged between the shift register 10 and the display region AA can shorten a length of the wire connecting the transistor and the power supply voltage signal line, save the wiring space of the non-display region NA, and increase the distance between the display region AA and each of two transistors. In this way, the effect of the high temperature operating environment for the display region AA on the threshold voltage of the output transistor is reduced, thereby reducing the probability of abnormal phenomena, such as splash screen display.

As shown in FIG. 9, when extending from the non-display region NA towards the display region AA, the connection line 40 is insulated from and intersects with the first power supply voltage signal line VG1 and the second power supply voltage signal line VG2. In some embodiments, each of the first power supply voltage signal line VG1 and the second power supply voltage signal line VG2 transmits a corresponding constant voltage signal, then the first power supply voltage signal line VG1 and the second power supply voltage signal line VG2 have a small effect on the signal transmitted on the connection line 40 when the first power supply voltage signal line VG1 and the second power supply voltage signal line VG2 overlap with the connection line 40, and the stability of the signal on the connection line 40 can also be ensured.

In some embodiments, as shown in FIG. 9, the first clock signal line CK1 and the second clock signal line CK2 are located at a side of the shift register 10 away from the display region AA. When extending from the non-display region NA towards the display region AA, the connection line 40 does not intersect with the clock signal line, thereby reducing the number of the driving signal lines 30 overlapping with the connection line 40 and reducing the load on the connection line 40. In this way, it can avoid that the voltage jump on the clock signal line may affect the signal on the connection line 40, thereby ensuring the stability of the signal transmitted on the connection line 40 and improving the display uniformity.

Figure 10:
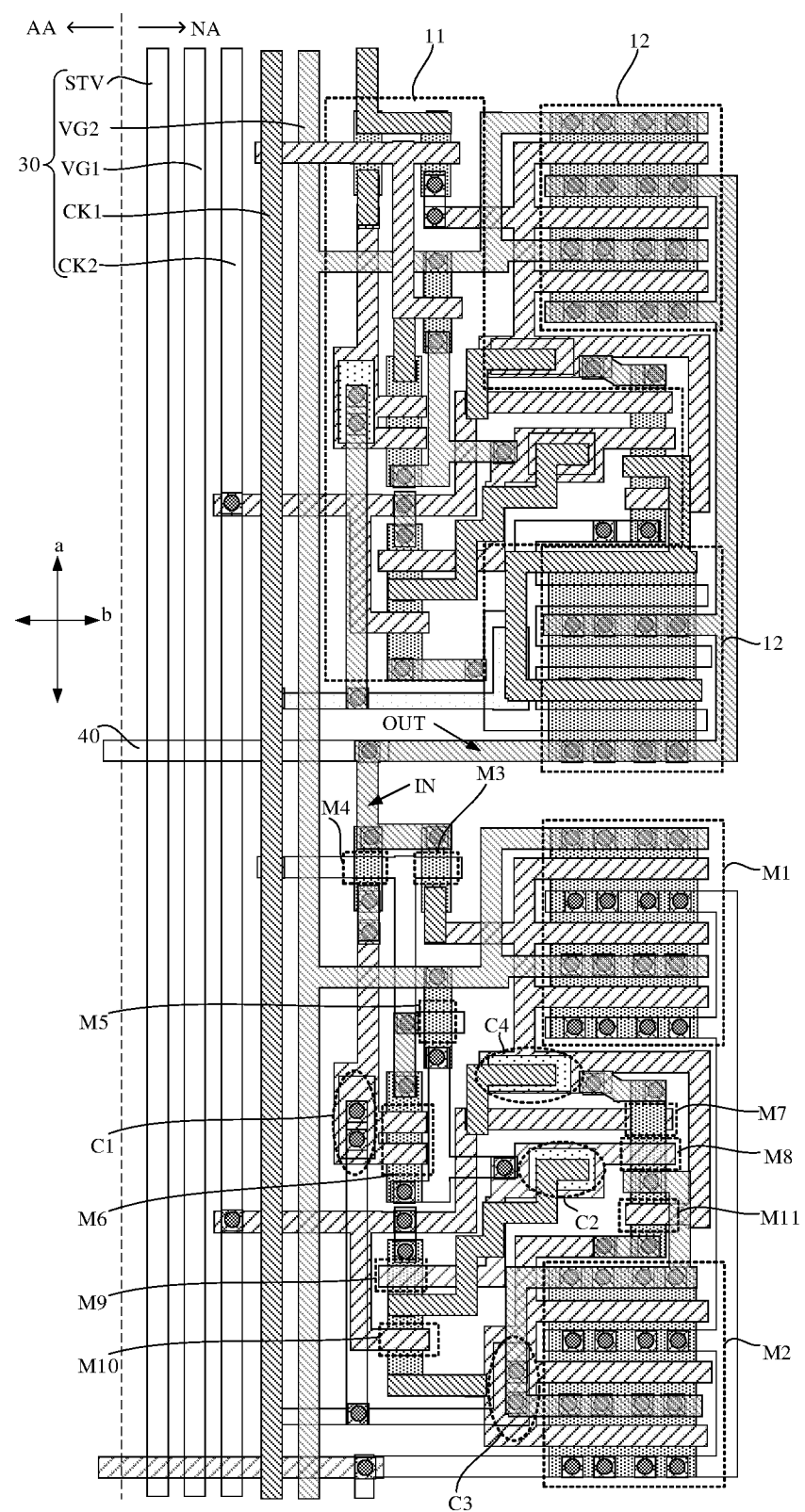
FIG. 10 is another partial schematic diagram of a display panel according to some embodiments of the present disclosure.

In other embodiments, FIG. 10 is another partial schematic diagram of a display panel according to some embodiments of the present disclosure, and FIG. 10 shows the positions of two shift registers 10 cascaded and arranged along the first direction a. The structure of the shift register 10 in FIG. 10 can be understood in conjunction with the circuit diagram shown in FIG. 8. The embodiments of FIG. 10 can be understood with reference to the above embodiments of FIG. 6. An only difference between the embodiments of FIG. 10 and the embodiments of FIG. 6 is the specific structures of the switch module 11 and the output module 12 in the shift register 10.

As shown in FIG. 10, the first power supply voltage signal line VG1, the second power supply voltage signal line VG2, the first clock signal line CK1, and the second clock signal line CK2 are all located between the shift register 10 and the display region AA. In the second direction b, the first clock signal line CK1 and the second clock signal line CK2 are located between the first power supply voltage signal line VG1 and the second power supply voltage signal line VG2. By pulling towards the display region AA along the second direction b, the shift register 10 can be connected to corresponding first power supply voltage signal line VG1, second power supply voltage signal line VG2, first clock signal line CK1, and second clock CK2, without increasing the length of the wiring. With such configuration, the wiring space in the non-display region NA can be saved, and the distance between the display region AA and each of the two output transistors can be increased, thereby reducing an effect of the high temperature operating environment for the display region AA on the threshold voltage of the output transistor, thus reducing the probability of abnormal phenomena, such as splash screen display.

In some embodiments, as shown in FIG. 10, the start signal line STV is one of the driving signal lines 30 that is closest to the display region AA, which can shorten the length of the connection line segment connecting the shift register 10 and the driving signal line 30, and can also avoid overlapping between the connection line segment and the start signal line STY.

Figure 11:
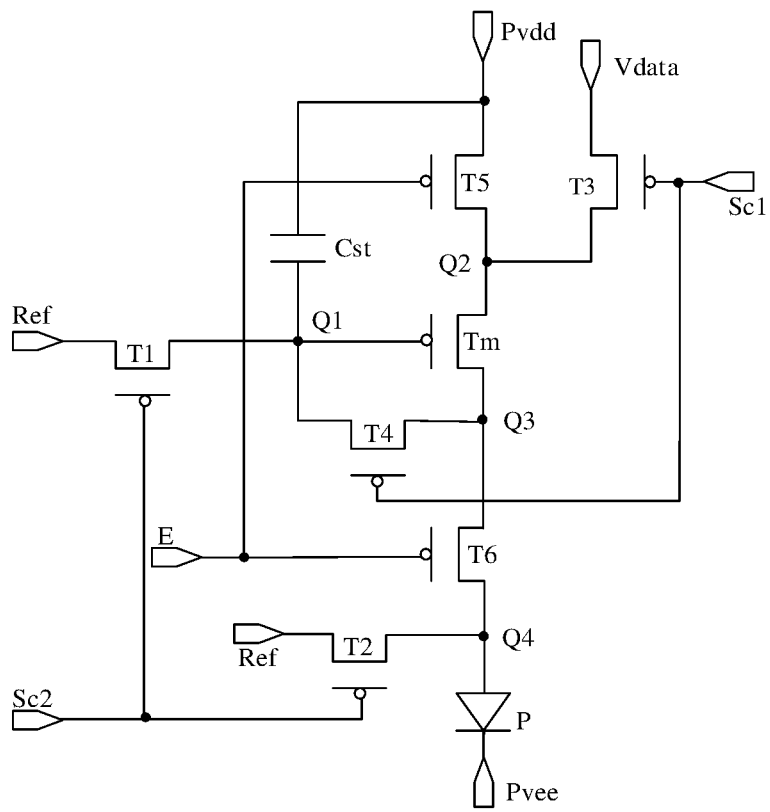
FIG. 11 is a schematic diagram of a pixel circuit in a display panel according to some embodiments of the present disclosure.

The display panel according to the embodiments of the present disclosure includes multiple light-emitting elements and multiple pixel circuits coupled to the multiple light-emitting elements. The light-emitting element can be an inorganic light-emitting diode or an organic light-emitting diode. FIG. 11 is a schematic diagram of a pixel circuit in a display panel according to some embodiments of the present disclosure. As shown in FIG. 11, the pixel circuit includes a driving transistor Tm, a gate reset transistor T1, an electrode reset transistor T2, a data writing transistor T3, a threshold compensation transistor T4, a first light-emitting control transistor T5, and a second light-emitting control transistor T6. A first electrode of the gate reset transistor T1 is coupled to a reset line Ref, and a second electrode of the gate reset transistor T1 is coupled to the node Q1. A gate of the driving transistor Tm is coupled to a node Q1, a first electrode of the driving transistor Tm is coupled to the node Q2, and a second electrode of the driving transistor Tm is coupled to the node Q3. The driving transistor Tm is connected in series between the first light-emitting control transistor T5 and the second light-emitting control transistor T6. A first electrode of the data writing transistor T3 is coupled to a data line Vdata, a second electrode of the data writing transistor T3 is coupled to the node Q2, and the threshold compensation transistor T4 is connected in series between the node Q1 and the node Q3. Each of a first electrode plate of the storage capacitor Cst and the first electrode of the first light-emitting control transistor T5 is coupled to a positive power supply line Pvdd. A first electrode of the electrode reset transistor T2 is coupled to the reset line Ref, and a second electrode of the electrode reset transistor T2 and a first electrode of the light-emitting element P are coupled to a node Q4. A second electrode of the light-emitting element P is coupled to a negative power supply line Pvee. A gate of the data writing transistor T3 and a gate of the threshold compensation transistor T4 are coupled to a first gate line Sc1, a gate of the gate reset transistor T1 and a gate of the electrode reset transistor T2 are coupled to a second gate line Sc2, and a gate of the first light-emitting control transistor T5 and a gate of the second light-emitting control transistor T6 are coupled to a light-emitting control line E.

The pixel circuit in FIG. 11 is merely schematic and not limited in the present disclosure. The display panel is provided with scanning signal lines coupled to the shift registers 10. The gate lines (the first gate line Sc1 and the second gate line Sc2 that are shown in FIG. 11) and the light-emitting control line E are the scanning signal lines. The shift registers 10 in the non-display region NA include a scanning shift register and a light-emitting shift register, the gate line is coupled to the scanning shift register, and the light-emitting control line E is coupled to the light-emitting shift register. In a display panel according to some embodiments of the present disclosure, the scanning shift register adopts the circuit structure shown in FIG. 3, and the light-emitting shift register adopts the circuit structure shown in FIG. 8.

Figure 12:
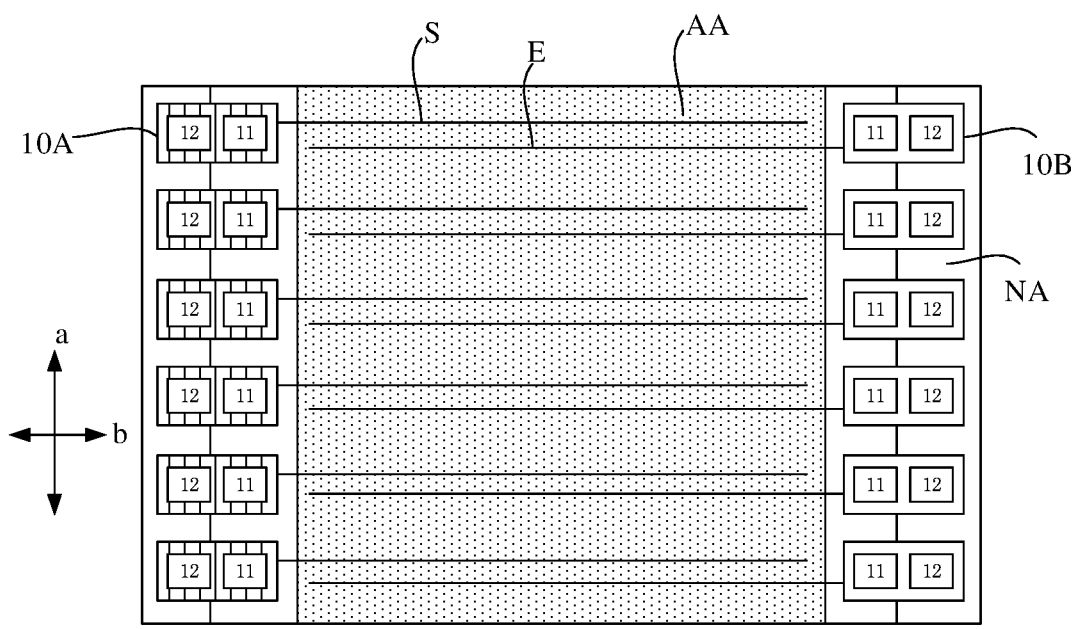
FIG. 12 is another schematic diagram of a display panel according to some embodiments of the present disclosure.

In some embodiments, FIG. 12 is another schematic diagram of a display panel according to some embodiments of the present disclosure. FIG. 12 illustrates a portion of the display region AA, and a non-display region NA located at two sides of the display region AA. Both the scanning shift register 10A and the light-emitting shift register 10B in FIG. 12 are simplified. As shown in FIG. 12, in the second direction b, the scanning shift register 10A and the light-emitting shift register 10B are located at two sides of the display region AA. The gate line S is coupled to the scanning shift register 10A, and the light-emitting control line E is coupled to the light-emitting shift register 10B. In the scanning shift register 10A, the output module 12 is located at a side of the switch module 11 away from the display region AA, that is, the output transistor is located at a side of the switch module 11 away from the display region AA. In the light-emitting shift register 10B, the output module 12 is located at a side of the switch module 11 away from the display region AA, and the output transistor is located at a side of the switch module 11 away from the display region AA. In the embodiments, only one type of shift register is provided at one side of the display region AA, thereby reducing widths of frames located at two sides of the display region AA along the second direction b. The embodiments can reduce the effect of the high temperature operating environment for the display region AA on the threshold voltage of the output transistor in the scanning shift register 10A, and can avoid that the scanning shift register 10A outputs an abnormal signal to the display region AA due to the increase in the threshold voltage of the output transistor in the scanning shift register 10A during the display operation. Meanwhile, the embodiments can reduce the effect of the high temperature operating environment for the display region AA on the threshold voltage of the output transistor in the light-emitting shift register 10B, and can avoid that the light-emitting shift register 10B outputs an abnormal signal to the display region AA due to the increase in the threshold voltage of the output transistor in the light-emitting shift register 10B during the display operation. The embodiments can reduce the probability of occurrence of abnormal phenomena, such as splash screen display.

In other embodiments, in the second direction b, the scanning shift register 10A and the light-emitting shift register 10B are located at two sides of the display region AA. In at least one of the scanning shift register 10A or the light-emitting shift register 10B, the output transistor is arranged at a side of the switch module 11 away from the display region AA, which is not shown in the drawings herein.

Figure 13:
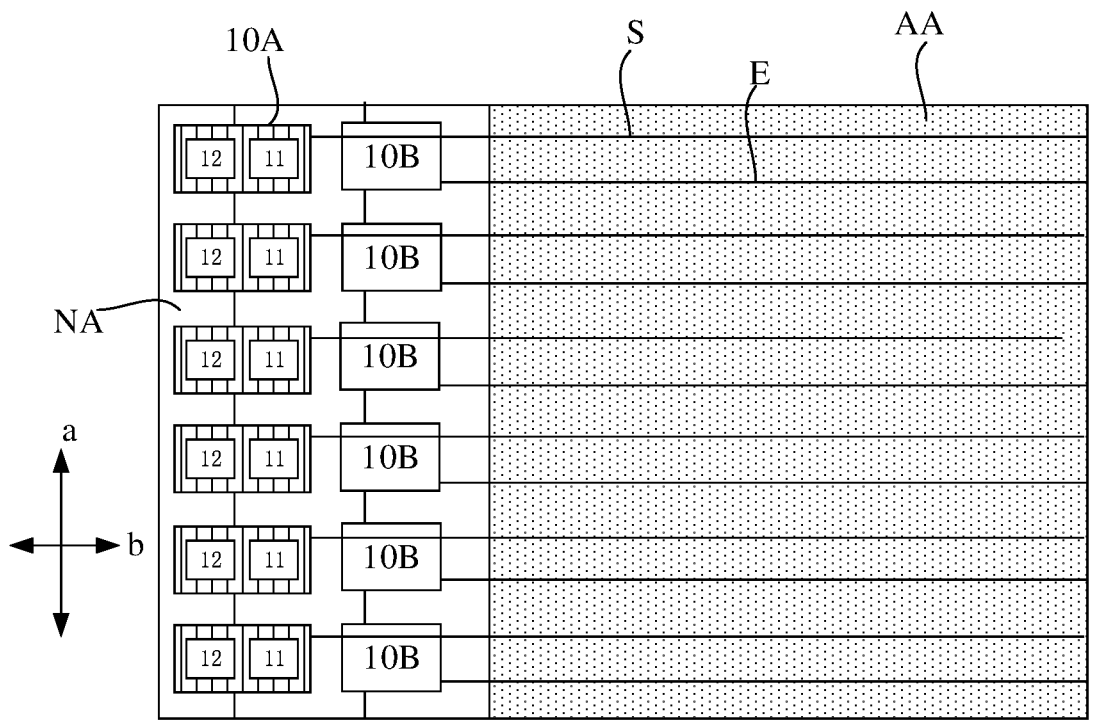
FIG. 13 is another schematic diagram of a display panel according to some embodiments of the present disclosure.

In other embodiments, FIG. 13 is another schematic diagram of a display panel according to some embodiments of the present disclosure. FIG. 13 only shows a partial region of the display panel. As shown in FIG. 13, in the second direction b, the light-emitting shift register 10B and the scanning shift register 10A are located at a same side of the display region AA, and the light-emitting shift register 10B is located at a side of the scanning shift register 10A close to the display region AA. In the scanning shift register 10A, the output module 12 is located at a side of the switch module 11 away from the display region AA. With reference to the pixel circuit diagram shown in FIG. 11, the gate of the data writing transistor T3 is coupled to the first gate line Sc1, the gate of the gate reset transistor T1 is coupled to the second gate line Sc2, the data writing transistor T3 is configured to write a data voltage to the node Q1, the gate reset transistor T1 is configured to reset the node Q1, and the potential of the node Q1 may affect the stability of a driving current output by the driving transistor Tm, thereby affecting the light-emitting of the light-emitting element P. The first gate line Sc1 and the second gate line Sc2 are connected to two cascaded scanning shift registers 10A. The stability of the signals on the first gate line Sc1 and the second gate line Sc2 has a great influence on the light-emitting of the light-emitting element P. When the light-emitting shift register 10B and the scanning shift register 10A are located at a same side of the display region AA, the positions of the switch module 11 and the output module 12 in the scanning shift register 10A with respect to the display region AA are designed in such a manner that the output module 12 is arranged at a side of the switch module 11 away from the display region AA. In this way, it can reduce the effect of the high temperature operating environment for the display region AA on the threshold voltage of the output transistor in the scanning shift register 10A, and it also can avoid that the scanning shift register 10A outputs an abnormal signal to the display region AA due to the increase in the threshold voltage of the output transistor in the scanning shift register 10A during display operation. Therefore, the probability of occurrence of abnormal phenomena, such as splash screen display can be reduced.

Figure 14:
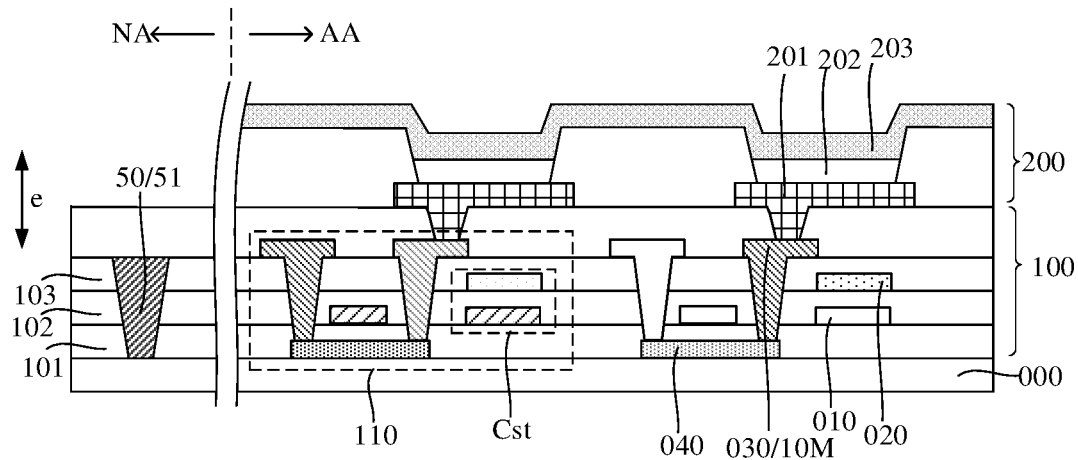
FIG. 14 is another cross-sectional view of a display panel according to some embodiments of the present disclosure.

FIG. 14 is another cross-sectional view of a display panel according to some embodiments of the present disclosure. In some embodiments, as shown in FIG. 14, the array layer 100 and the display layer 200 are located at a side of the substrate 000. The shift register 10 is located in the array layer 100, and the display layer 200 is located at a side of the array layer 100 away from the substrate 000. The array layer 100 includes a first metal layer 010, a second metal layer 020, a third metal layer 030, and a semiconductor layer 040. An insulating layer is respectively provided between adjacent metal layers and between the metal layers and the semiconductor layer. The display layer 200 includes a first electrode layer 201, a light-emitting layer 202, and a second electrode layer 203. The first electrode layer 201 includes multiple first electrodes that are patterned. In the embodiments, the third metal layer 030 is a metal layer closest to the first electrode layer 201 in a direction e perpendicular to the plane of the substrate 000, and the third metal layer 030 is a target metal layer 10M. A groove 50 is provided in the non-display region NA, and the groove 50 penetrates through at least one insulating layer located between the semiconductor layer 040 and the target metal layer 10M along the direction e perpendicular to the plane of the substrate 000. A bottom of the groove 50 does not need to expose the semiconductor layer or other metal layer. The insulating layers between the semiconductor layer 040 and the target metal layer 10M includes a first insulating layer 101 located between the semiconductor layer 040 and the first metal layer 010, a second insulating layer 102 located between the first metal layer 010 and the second metal layer 020, and a third insulating layer 103 located between the second metal layer 020 and the third metal layer 030. FIG. 14 illustrates the pixel circuit 110 in the display region AA, and the pixel circuit 110 is located in the array layer 100.

Figure 15:
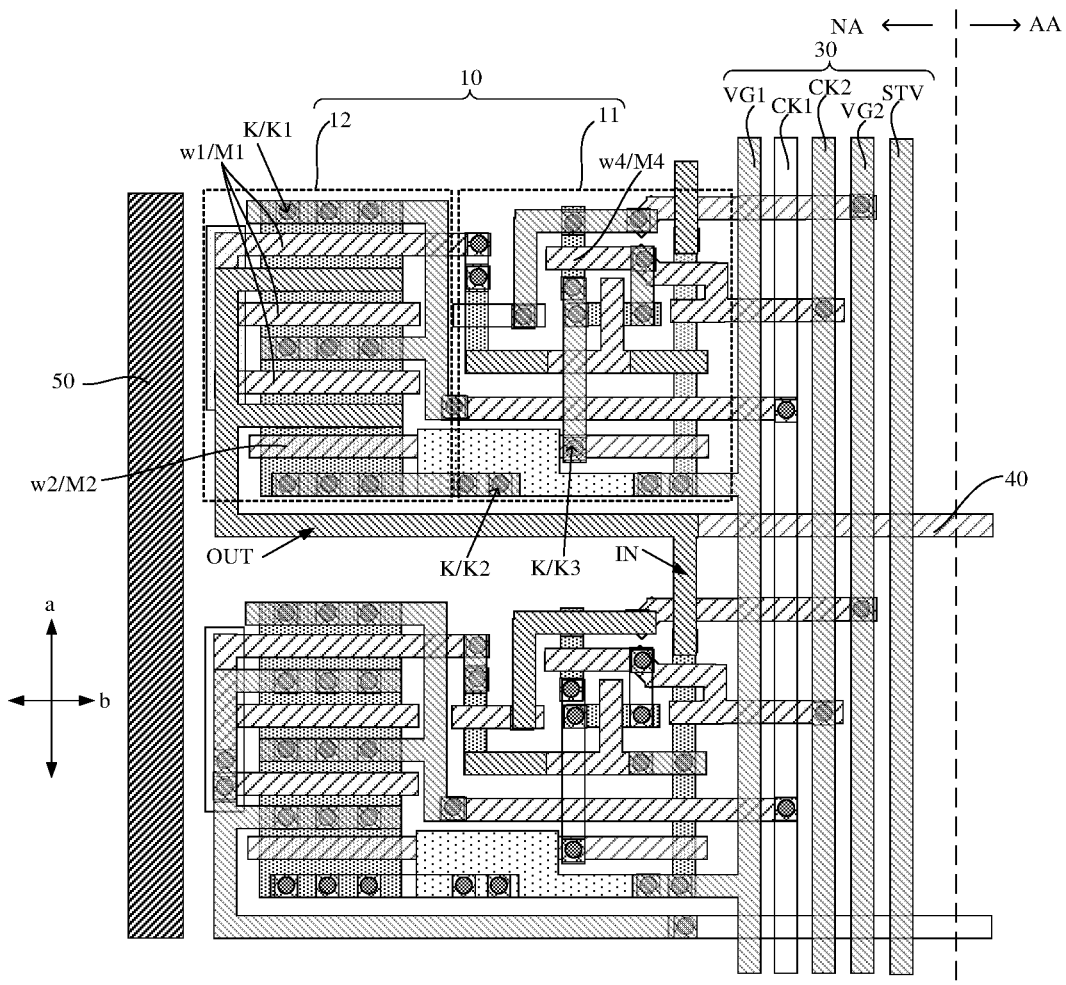
FIG. 15 is another schematic diagram of a display panel according to some embodiments of the present disclosure.

FIG. 15 is another schematic diagram of a display panel according to some embodiments of the present disclosure. As shown in FIG. 15, the groove 50 is located at a side of the switch module 11 away from the display region AA. In the embodiments of the present disclosure, the output module 12 is located at a side of the switch module 11 away from the display region AA, and then a distance between the groove 50 and the output transistor in the output module 12 is relatively short. The groove 50 in the insulating layer of the array layer 100 can reduce an area of the inorganic insulating layer and thus reduce a hydrogen content in the insulating layer. When the insulating layer is annealed, more hydrogen can be evaporated from the groove 50, so as to adjust the threshold voltage of the transistor. In the embodiments of the present disclosure, the groove 50 is located at a side of the switch module 11 away from the display region AA, thereby reducing the threshold voltage of the output transistor and compensating the threshold voltage of the output transistor affected by the high temperature operating environment for the display region AA. The performance reliability of the shift register 10 is improved, and the probability of abnormal phenomena, such as splash screen display is reduced. The pixel circuit 110 is provided in the display region AA, the pixel circuit 11 includes a transistor, and the groove 50 is located at a side of the switch module 11 away from the display region AA, that is, the groove 50 is arranged away from the display region AA, which can avoid that the arrangement of the groove 50 affects the characteristics of the transistor in the pixel circuit 110.

As shown in FIG. 14, the array layer 100 includes three metal layers, i.e., a first metal layer 010, a second metal layer 020, and a third metal layer 030. The third metal layer 030 is a metal layer closest to the first electrode layer 201 in the direction e perpendicular to the plane of the substrate 000, and the third metal layer 030 is a target metal layer 10M.

In other embodiments, the array layer 100 includes four metal layers, i.e., a first metal layer 010, a second metal layer 020, a third metal layer 030, and a fourth metal layer, and the fourth metal layer is located at a side of the third metal layer 030 away from the substrate 000, and then the fourth metal layer is a metal layer closest to the first electrode layer 201 in the direction e perpendicular to the plane of the substrate 000, and the fourth metal layer is a target metal layer 10M. In some embodiments, the groove 50 penetrates through at least one insulating layer located between the semiconductor layer 040 and the fourth metal layer.

Multiple driving signal lines 30 each extending along the first direction a are provided in the non-display region NA, and the shift registers 10 are coupled to the driving signal lines 30. Among the multiple driving signal lines 30, that driving signal line located between the shift register 10 and the display region AA is a first driving signal line. The groove 50 is located at a side of the first driving signal line away from the display region AA. As shown in FIG. 5, at least part of the driving signal lines 30 is located at a side of the shift register 10 away from the display region AA, and the remaining part of the driving signal lines 30 is located at a side of the shift register 10 close to the display region AA. In the embodiments of FIG. 6, the driving signal lines 30 are all located at a side of the shift register 10 close to the display region AA. FIG. 15 only illustrates the arrangement of the driving signal lines 30 as shown in FIG. 6. The solution for arranging the grooves 50 in the non-display region NA is also applicable to the embodiments of FIG. 5.

In some embodiments, the top view of the display panel in FIG. 15 shows that the groove 50 is has a strip shape. FIG. 15 also shows a through-hole K in the circuit. The through-hole K penetrates through the insulating layer and can realize electrical connection between two structures located between different layers. In the embodiment shown in FIG. 15, a size of the groove 50 is much larger than a size of the through-hole K, and the size herein refers to an area size. The size of the groove 50 and the size of the through-hole K are of different orders of magnitude. In other embodiments, the size of the groove 50 and the size of the through-hole K can be of a same order of magnitude, that is, there is no significant difference between the size of the groove 50 and the size of the through-hole K.

In some embodiments, as shown in FIG. 15, in the second direction b, at least part of the groove 50 is located at a side of the output module 12 away from the switch module 11. That is, the groove 50 is arranged at a periphery of the shift register 10, and the arrangement of the groove 50 does not occupy the space inside the circuit structure of the shift register 10, so as to avoid that the space occupied by the circuit structure of the shift register 10 is increased due to increase in the length of the connecting wire connecting the output module 12 and the switch module 11. The groove 50 is arranged at the side of the output module 12 away from the switch module 11, which not only makes the groove 50 far away from the display region AA, but also makes the groove 50 be far away from the transistor in the switch module 11. In this way, the groove 50 can be used to adjust the threshold voltage of the transistor in the output module 12, thereby preventing affecting the characteristic of the transistor in the display region AA or the switch module 11.

In other embodiments, the groove 50 is located at a side of the switch module 11 away from the display region AA, and at least part of the groove 50 is located between the switch module 11 and the output module 12, which is not shown in the drawings herein.

As shown in FIG. 14, the groove 50 includes a first groove 51. In the direction e perpendicular to the plane of the substrate 000, the first groove 51 penetrates through all the insulating layers located between the semiconductor layer 040 and the target metal layer 10M. For example, the array layer 100 includes three metal layers. During the manufacture of the display panel, the semiconductor layer 040, the first metal layer 010, and the second metal layer 020 are sequentially formed on the substrate 000, and then the insulating layer is punched to form a hole before the third metal layer 030 (the target metal layer 10M in the embodiments) is formed, and then the third metal layer 030 is formed after the punching process. Referring to FIG. 15, the through-holes in the display panel include at least a first through-hole K1, a second through-hole K2, and a third through-hole K3. The first through-hole K1 connects the third metal layer 030 and the semiconductor layer 040, the second through-hole K2 connects the third metal layer 030 and the second metal layer 020, and the third through-hole K3 connects the third metal layer 030 and the first metal layer 010. In the embodiments of the present disclosure, the first groove 51 can be formed in the punching process before forming the target metal layer 10M, and no other metal structure is arranged below the first groove 51, then the first groove 51 can penetrate through all insulating layers located between the semiconductor layer 040 and the target metal layer 10M. There is no need to add new process when forming the first groove 51.

Figure 16:
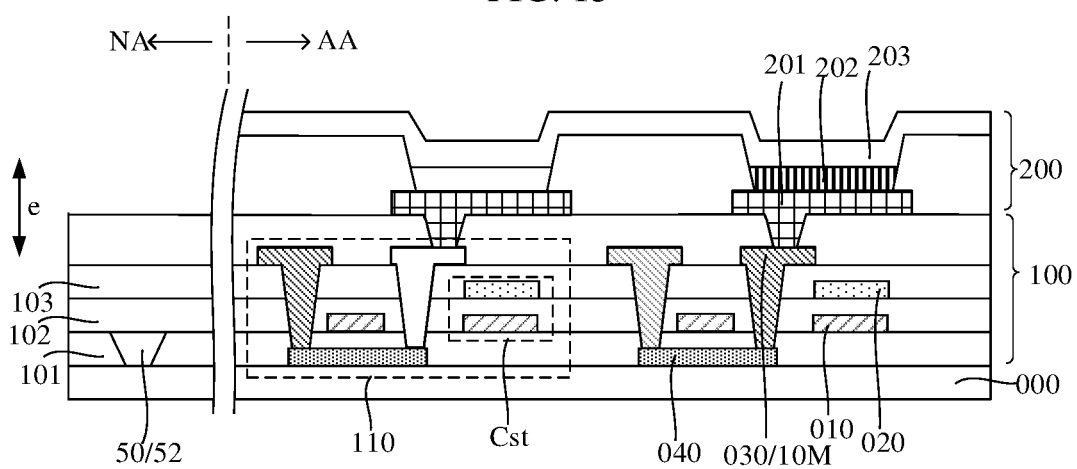
FIG. 16 is another cross-sectional view of a display panel according to some embodiments of the present disclosure.

FIG. 16 is another cross-sectional view of a display panel according to some embodiments of the present disclosure. In some embodiments, as shown in FIG. 16, the array layer 100 includes a first insulating layer 101, and the first insulating layer 101 is located at a side of the semiconductor layer 040 away from the substrate 000 and is in contact with the semiconductor layer 040. The groove 50 includes a second groove 52 which penetrates through at least the first insulating layer 101. In the shift register 10, the output transistor includes a channel, which is a portion of the semiconductor layer 040 that overlaps with the gate. That is, the channel of the output transistor is located in the semiconductor layer 040, and it is considered that the closer the insulating layer is to the channel, the hydrogen content in the insulating layer has a greater influence on the threshold voltage of the output transistor. In the embodiments of the present disclosure, the second groove 52 penetrates through at least the first insulating layer 101 in contact with the semiconductor layer 040, and the second groove 52 is provided to remove part of the first insulating layer 101, and the area of the second groove 52 is related to the amount of hydrogen that can be reduced, and, in turn, is related to the adjustment amount of the threshold voltage of the output transistor. The second groove 52 penetrating through the first insulating layer 101 can adjust the threshold voltage of the output transistor to a large extent, then the area of the second groove 52 does not need to be too large, which is beneficial to save the layout space of the non-display region NA.

Figure 17:
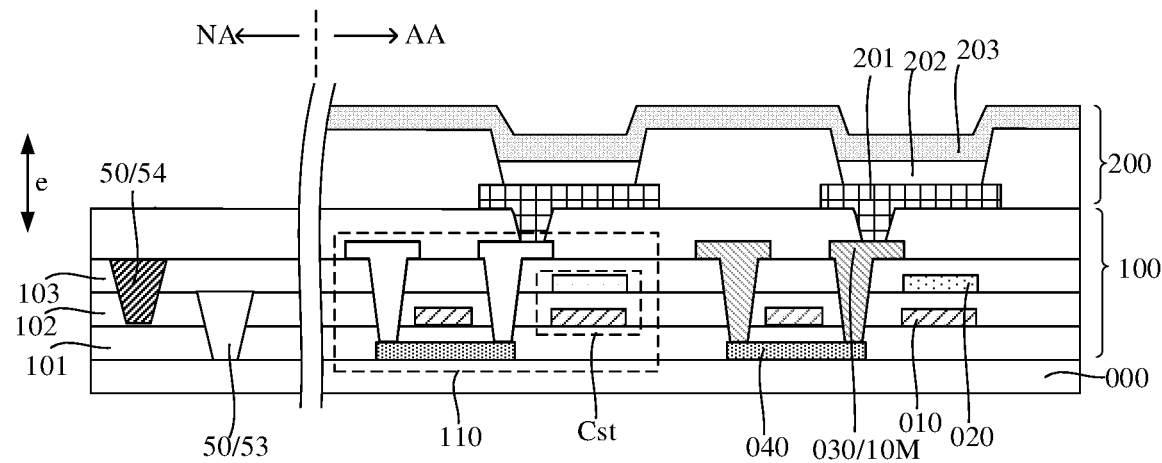
FIG. 17 is another cross-sectional view of a display panel according to some embodiments of the present disclosure.

FIG. 17 is another cross-sectional view of a display panel according to some embodiments of the present disclosure. In other embodiments, as shown in FIG. 17, the grooves 50 include a third groove 53 and a fourth groove 54. In the direction e perpendicular to the plane of the substrate 000, the third groove 53 and the fourth groove 54 have different depths. That is, the thickness of the insulating layer penetrated by the third groove 53 and the thickness of the insulating layer penetrated by the fourth groove 54 are different from each other, or the number of the layers penetrated by the third groove 53 is different from the number of the layers penetrated by the fourth groove 54, then the third groove 53 and the fourth groove 54 can be arranged at different positions. The grooves 50 with different depths can be arranged near the output transistor according to the layout positions of the transistors in the shift register 10 and the wiring arrangement, to avoid the short-circuit in the shift register 10 due to the arrangement of the grooves 50. The depth of the third groove 53 is different from the depth of the fourth groove 54, so the third groove 53 and the fourth groove 54 have different adjustment capabilities to the threshold voltage of the output transistor, and the adjustment amount of the threshold voltage of the output transistor can meet the design needs by setting positions and depths of the third groove 53 and the fourth groove 54.

FIG. 17 only illustrates that the third groove 53 penetrates through the first insulating layer 101 and the second insulating layer 102, and the fourth groove 54 penetrates through the second insulating layer 102 and the third insulating layer 103. In the embodiments of the present disclosure, the groove 50 can continuously penetrate through one layer, two layers or three layers of the first insulating layer 101, the second insulating layer 102, and the third insulating layer 103. In some embodiments, the groove 50 penetrates part of an insulating layer. For example, the groove 50 penetrates through the third insulating layer 103 and penetrates part of the second insulating layer 102; or the groove 50 penetrates through the third insulating layer 103, the second insulating layer 102, and penetrates part of the first insulating layer 101. The adjustment capability to the threshold voltage of the output transistor will be affected by the depth of the groove 50, the relative position between the groove 50 and the output transistor, and so on. In the embodiments of the present disclosure, the depth and the position of the groove 50 can be designed according to specific design requirements.

A channel w1 of the first output transistor M1, a channel w2 of the second output transistor M2, and a channel w4 of the fourth switch transistor M4 in the switch module 11 are marked in FIG. 15. It can be seen that the distance between the groove 50 and the channel of the output transistor is smaller than the distance between the groove 50 and the channel of the switch transistor. When comparing the distances, the distance refers to the minimum distance between two structures. The embodiments utilize the groove 50 to adjust the threshold voltage of the transistor in the output module 12, and at the same time, it avoids that the configuration of the groove 50 affects the characteristics of the transistor in the switch module 11.

Figure 18:
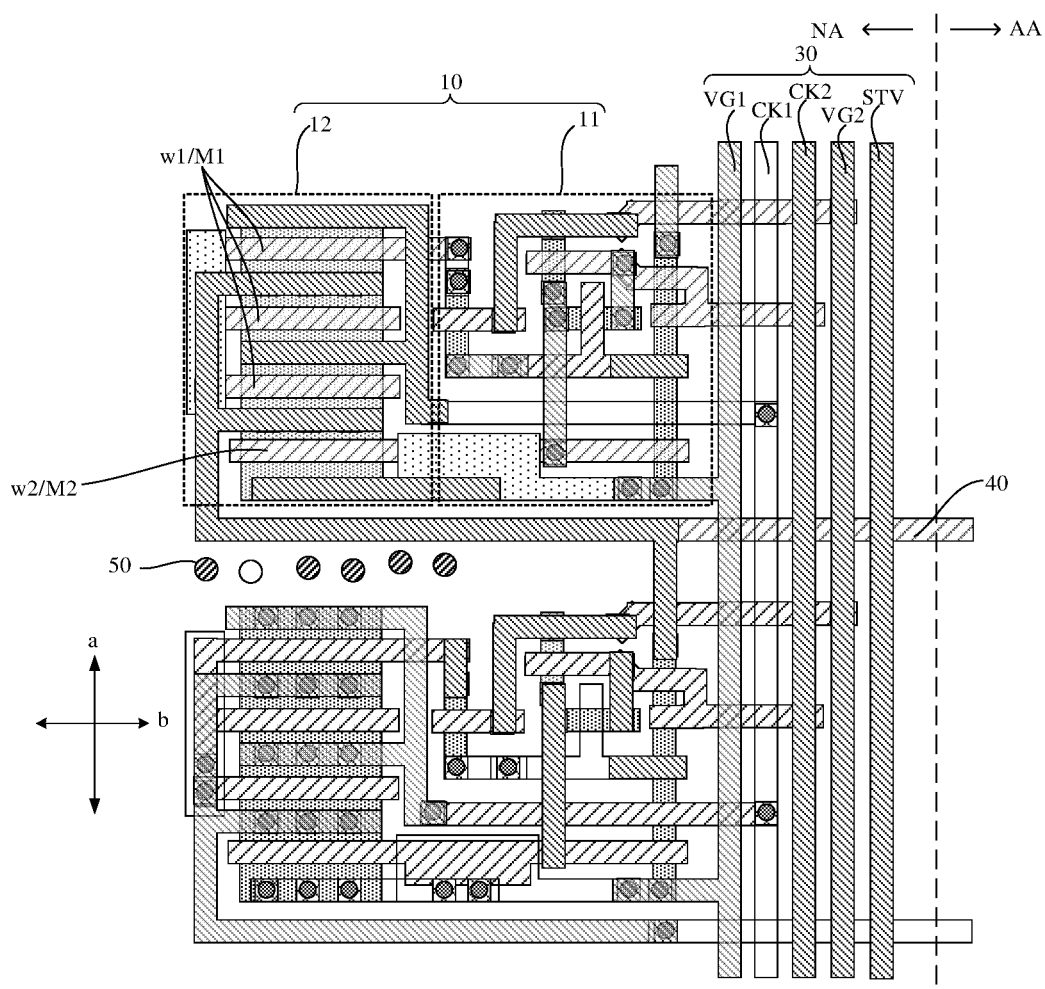
FIG. 18 is another schematic diagram of a display panel according to some embodiments of the present disclosure.

FIG. 18 is another schematic diagram of a display panel according to some embodiments of the present disclosure. In some embodiments, as shown in FIG. 18, multiple grooves 50 are provided in the non-display region NA. In the first direction a, at least one groove 50 is located between two adjacent shift registers 10. By using the groove 50 located between two adjacent shift registers 10, the threshold circuits of the output transistors in the two shift registers 10 can be adjusted, and the groove 50 provided in the embodiments does not affect the space occupied by the circuit structure in the second direction b, which is beneficial to the narrowing design of the frame of the display panel.

FIG. 18 exemplarily illustrates that the shape of the groove 50 is a circle. In some embodiments, the area of the groove 50 and the size of the through-hole in the circuit structure of the shift register 10 are of a same order of magnitude, that is, the area of the groove 50 can be substantially the same as the area of the through-hole. In the embodiments, the area of a single groove 50 is relatively small, and the position of the groove 50 can be set flexibly. For example, the groove 50 can be arranged in a gap between lines in the circuit structure of the shift register 10, which not only can adjust the threshold voltage of the output transistor, but also does not increase the space occupied by the shift register 10 in the non-display region NA.

The channel w1 of the first output transistor M1 and the channel w2 of the second output transistor M2 are illustrated in FIG. 15. It can be seen from FIG. 15 that the groove 50 overlaps with the channel w1 of the first output transistor M1 in the second direction b, and the groove 50 overlaps with the channel w2 of the second output transistor M2 in the second direction b. The second direction b and the first direction a are perpendicular to each other. Such configuration can facilitate discharge of hydrogen near the channel of the output transistor, which is beneficial to reduce the hydrogen content near the output transistor, and is also beneficial to the adjustment of the threshold voltage of the output transistor.

The channel w1 of the first output transistor M1 and the channel w2 of the second output transistor M2 are illustrated in FIG. 18. It can be seen from FIG. 18 that the groove 50 overlaps with the channel w1 of the first output transistor M1 in the first direction a, and the groove 50 overlaps with the channel w2 of the second output transistor M2 in the first direction a. Such configuration can facilitate discharge of hydrogen near the channel of the output transistor, which is beneficial to reduce the hydrogen content near the output transistor, and is also beneficial to the adjustment of the threshold voltage of the output transistor.

Figure 19:
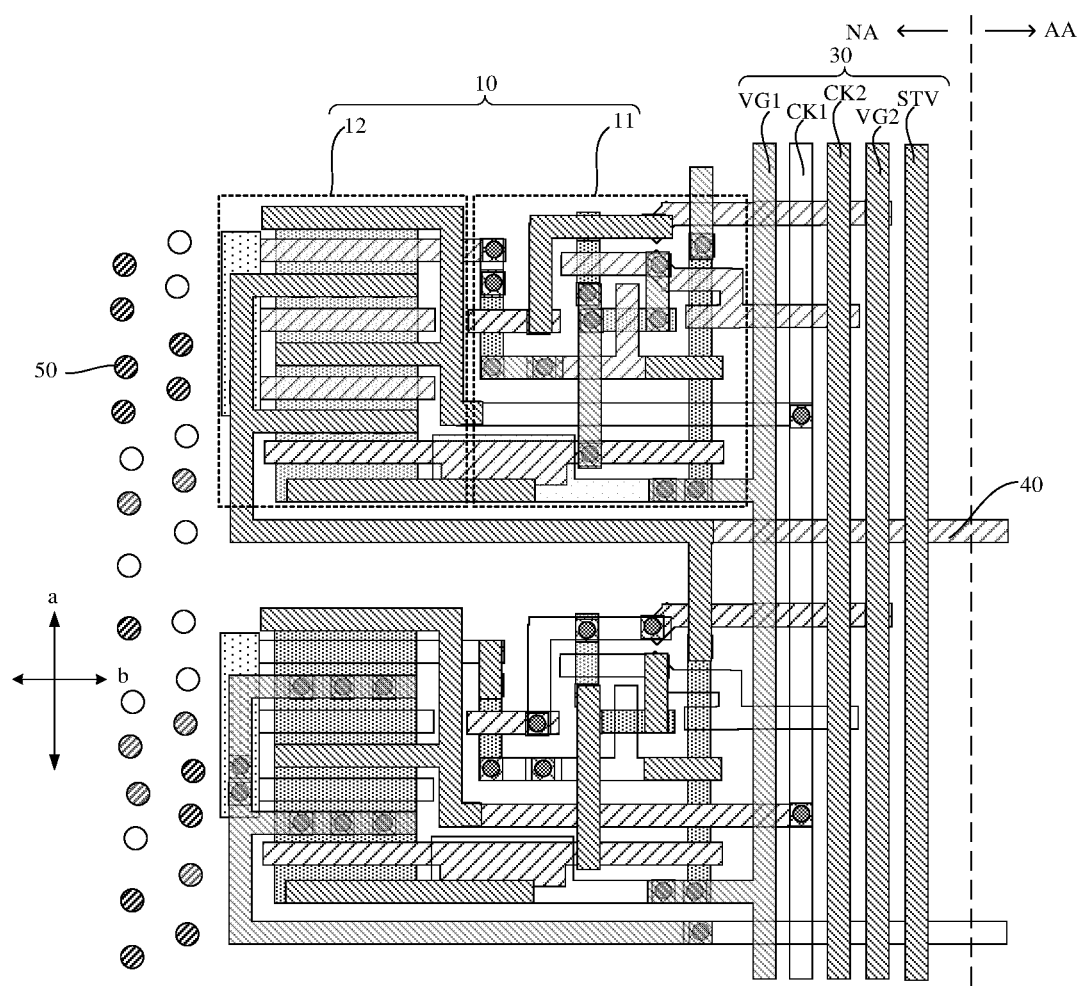
FIG. 19 is another schematic diagram of a display panel according to some embodiments of the present disclosure.

FIG. 19 is another schematic diagram of a display panel according to some embodiments of the present disclosure. In some embodiments, as shown in FIG. 19, in the second direction b, at a side of the output module 12 away from the switch module 11, multiple grooves 50 are arranged along the first direction a. The groove 50 is has a small size, and in some embodiments, the area of the groove 50 is not much different from the area of the through-hole in the circuit structure of the shift register 10, so the groove 50 can be configured according to the specific position where the hydrogen content needs to be reduced. The position of the groove 50 can be flexibly set to achieve relatively accurate adjustment of the threshold voltage. Multiple grooves 50 are arranged along the first direction a, and the capability to adjust the threshold voltage of the output transistor is increased by the superposition of the number of the grooves 50.

Figure 20:
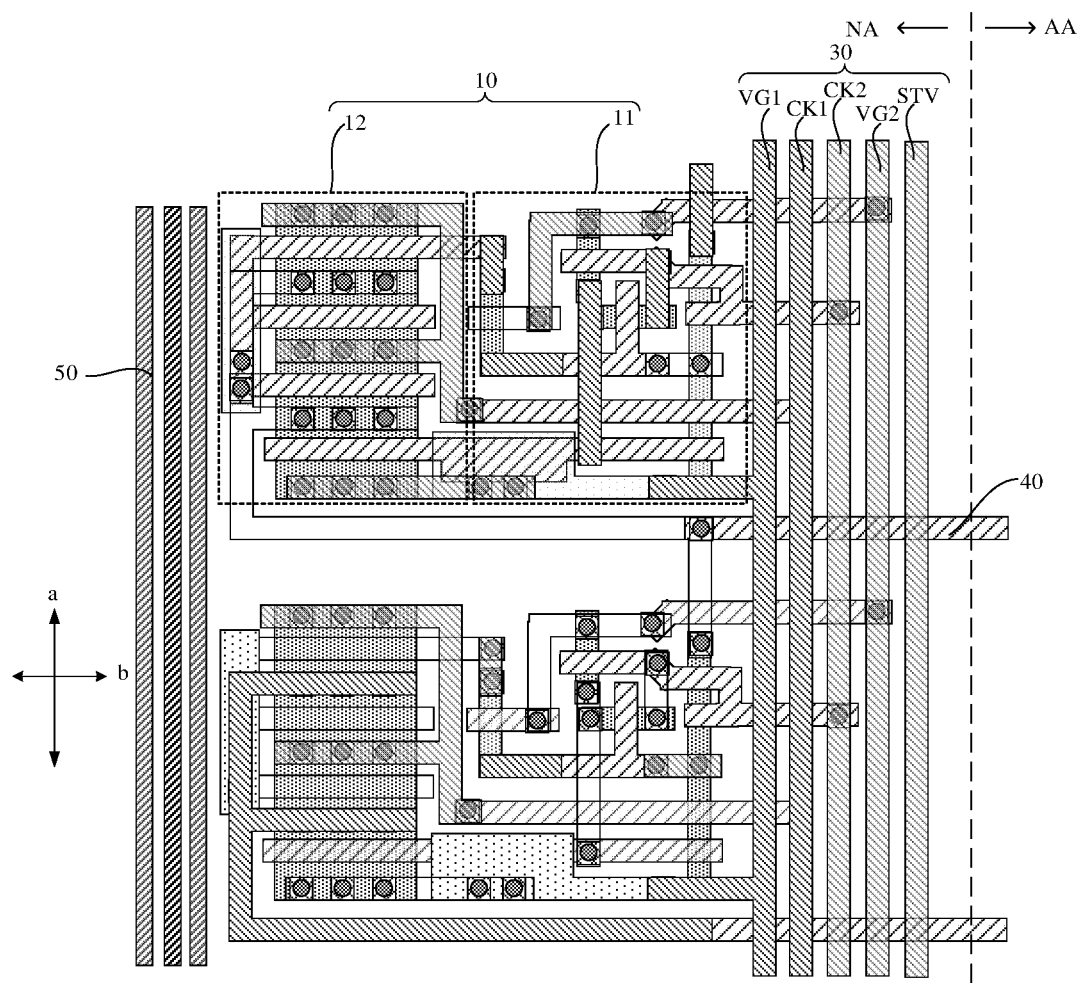
FIG. 20 is another schematic diagram of a display panel according to some embodiments of the present disclosure.

FIG. 20 is another schematic diagram of a display panel according to some embodiments of the present disclosure. In some embodiments, as shown in FIG. 20, a length of at least part of the grooves 50 in the first direction a is greater than its length in the second direction b. In the embodiments, the groove 50 has a strip shape, and has a size and an area larger than a size and an area of the through-hole in the circuit structure of the shift register 10. The groove 50 has a relatively large area, then a part of the insulating layer with a relatively large area in the array layer is removed, and the hydrogen content in the insulating layer can be reduced more, which makes the capability to adjust the threshold voltage of the output transistor be relatively large. The threshold voltage of the output transistor can be reduced by reducing the number of grooves 50. FIG. 20 only schematically shows that the three grooves 50 are arranged in the second direction b, and the embodiments of the present disclosure do not limit the number of the grooves 50.

Figure 21:
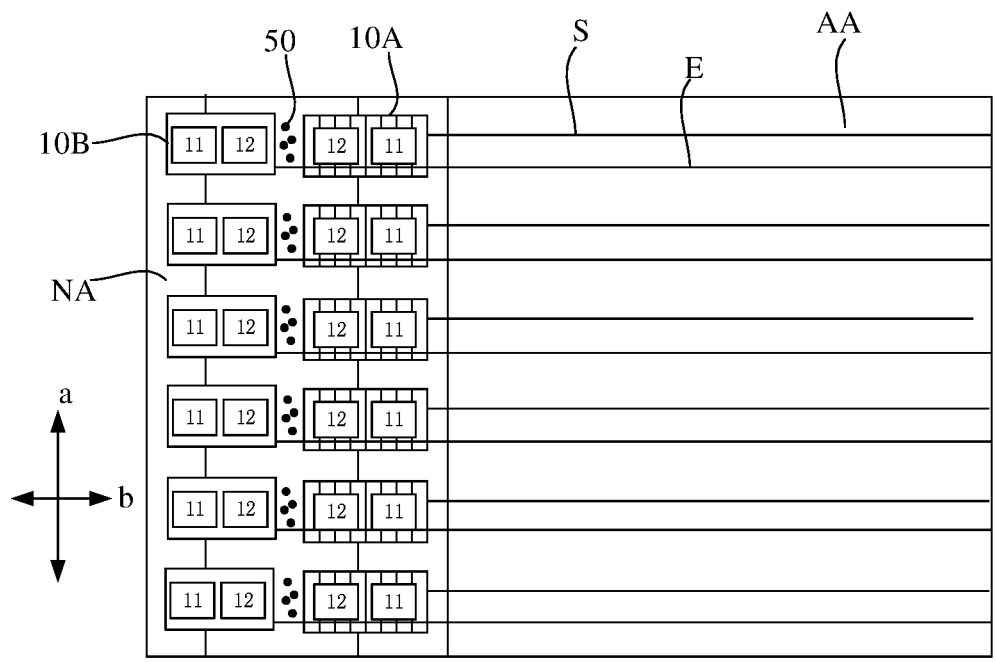
FIG. 21 is another schematic diagram of a display panel according to some embodiments of the present disclosure.

FIG. 21 is another schematic diagram of a display panel according to some embodiments of the present disclosure. In some embodiments, as shown in FIG. 21, in the second direction b, the scanning shift register 10A and the light-emitting shift register 10B are located at a same side of the display region AA, and the light-emitting shift register 10B is located at a side of the scanning shift register 10A away from the display region AA. In the scanning shift register 10A, the output module 12 is located at a side of the switch module 11 away from the display region AA, that is, the output transistor is located at a side of the switch module 11 away from the display region AA. In the light-emitting shift register 10B, the output module 12 is located at a side of the switch module 11 close to the display region AA, and at least part of the grooves 50 is located between the light-emitting shift register 10B and the scanning shift register 10A. In the embodiments, the threshold voltage of the output transistor in the scanning shift register 10A can be adjusted by using the groove 50, and the threshold voltage of the output transistor in the light-emitting shift register 10B can also be adjusted by using the groove 50. It avoids that the scanning shift register 10A outputs an abnormal signal to the display region AA due to increase in the threshold voltage of the output transistor in the scanning shift register 10A during display operation, and also avoids that the light-emitting shift register 10B outputs an abnormal signal to the display region AA due to increase in the threshold voltage of the output transistor in the light-emitting shift register 10B during display operation, thereby reducing the probability of occurrence of abnormal phenomena such as splash screen display.

In other embodiments, in the second direction b, the scanning shift register 10A and the light-emitting shift register 10B are located at a same side of the display region AA, and the light-emitting shift register 10B is located at a side of the scanning driving circuit 10A away from the display region AA. In the scanning shift register 10A, the output module 12 is located at a side of the switch module 11 away from the display region AA. In the light-emitting shift register 10B, the output module 12 is located at a side of the switch module 11 away from the display region AA, and at least part of the grooves 50 is located between the light-emitting shift register 10B and the scanning shift register 10A.

In other embodiments, in the second direction b, the scanning shift register 10A and the light-emitting shift register 10B are located at a same side of the display region AA, and the light-emitting shift register 10B is located at a side of the scanning shift register 10A close to the display region AA. In the scanning shift register 10A, the output module 12 is located at a side of the switch module 11 away from the display region AA. In the light-emitting shift register 10B, the output module 12 is located at a side of the switch module 11 away from the display region AA, and at least part of the grooves 50 is located between the light-emitting shift register 10B and the scanning shift register 10A, so that the threshold voltage of the output transistor in the light-emitting shift register 10B can be adjusted by using the grooves 50.

In other embodiments, in the second direction b, the scanning shift register 10A and the light-emitting shift register 10B are located at a same side of the display region AA, and the light-emitting shift register 10B is located at a side of the scanning shift register 10A close to the display region AA. In the scanning shift register 10A, the output module 12 is located at a side of the switch module 11 close to the display region AA. In the light-emitting shift register 10B, the output module 12 is located at a side of the switch module 11 away from the display region AA, and at least part of the grooves 50 is located between the light-emitting shift register 10B and the scanning shift register 10A, so that both the threshold voltage of the output transistor in the light-emitting shift register 10B and the threshold voltage of the output transistor in the scanning shift register 10A can be adjusted by using the grooves 50.

Figure 22:
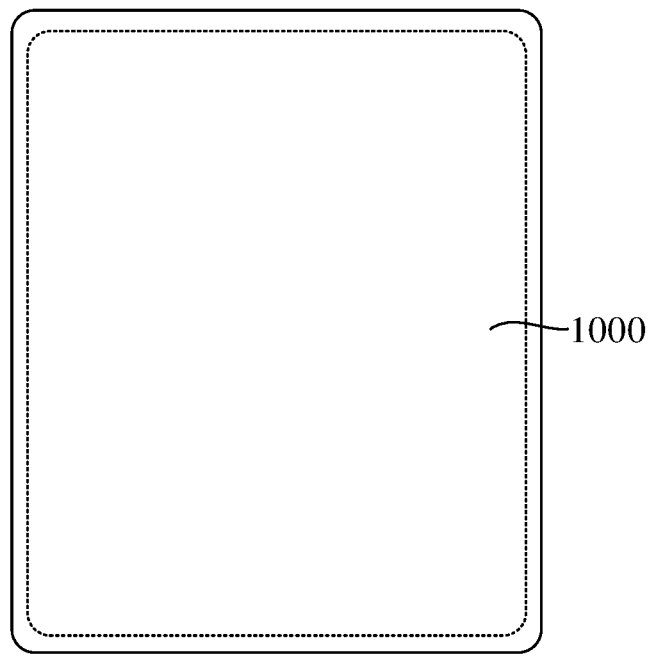
FIG. 22 is a schematic diagram of a display device according to some embodiments of the present disclosure.

Based on the same inventive concept, some embodiments of the present disclosure provide a display device. FIG. 22 is a schematic diagram of a display device according to some embodiments of the present disclosure. As shown in FIG. 22, the display device includes the display panel 1000 provided by any embodiment of the present disclosure. The structure of the display panel 1000 has been described in the above embodiments, and will not be repeated herein. The display device provided by the embodiments of the present disclosure can be any device with a display function, such as a mobile phone, a tablet computer, a notebook computer, and a television.

The above are merely some embodiments of the present disclosure, rather than limiting the present disclosure. Any modification, equivalent substitution, improvement, and so on, made within the principles of the present disclosure shall fall with a scope of the present disclosure.

It should be noted that the above embodiments are only used to illustrate the technical solutions of the present disclosure, rather than limiting the technical solutions of the present disclosure. Although the present disclosure is described in detail with reference to the foregoing embodiments, those skilled in the art shall understand that they can modify the technical solutions described in the foregoing embodiments, or make equivalent replacement to some or all of the technical features. These modifications or replacements shall fall within a scope of the technical solutions of the embodiments of the present disclosure without departing from the essence of the corresponding technical solutions.

What is claimed is:

1. A display panel comprising:
a display region;
a non-display region;
shift registers cascaded and arranged along a first direction and located in the non-display region,
wherein a shift register of the shift registers comprises a switch module and an output module, the output module is coupled to an output terminal of the shift register and comprises only and exactly two output transistors, and the two output transistors comprise a first output transistor and a second output transistor that are located at a side of the switch module away from the display region,
wherein the display panel further comprises driving signal lines arranged in the non-display region, each driving signal line of the driving signal lines extends along the first direction, and the shift registers are coupled to the driving signal lines,
wherein a control electrode of the first output transistor is coupled to a first node, a first electrode of the first output transistor is coupled to one of the driving signal lines, and a second electrode of the first output transistor is coupled to the output terminal of the shift register; and a control electrode of the second output transistor is coupled to a second node that is not directly connected to the first node, a first electrode of the second output transistor is coupled to another one of the driving signal lines, and a second electrode of the second output transistor is coupled to the output terminal of the shift register.

2. The display panel according to claim 1, wherein at least one of the driving signal lines is located between the shift registers and the display region.

3. The display panel according to claim 2, wherein the driving signal lines comprise a first power supply voltage signal line and a second power supply voltage signal line, wherein at least one of the first power supply voltage signal line or the second power supply voltage signal line is located between the shift registers and the display region.

4. The display panel according to claim 3, wherein the driving signal lines comprise a first clock signal line and a second clock signal line, wherein the first clock signal line and the second clock signal line are configured to transmit opposite voltage signals in at least one moment, and the first clock signal line and the second clock signal line are located between the shift registers and the display region.

5. The display panel according to claim 4, wherein the first clock signal line and the second clock signal line are located between the first power supply voltage signal line and the second power supply voltage signal line in a second direction intersecting with the first direction.

6. The display panel according to claim 2, wherein at least one of the driving signal lines is located at a side of the shift registers away from the display region.

7. The display panel according to claim 6, wherein the driving signal lines comprise a first clock signal line and a second clock signal line, wherein the first clock signal line and the second clock signal line are configured to transmit opposite voltage signals at a same moment, and at least one of the first clock signal line or the second clock signal line is located at a side of the shift registers away from the display region.

8. The display panel according to claim 6, wherein the driving signal lines further comprise a start signal line, wherein an input terminal of a first shift register of the shift registers that is effective is coupled to the start signal line, and the start signal line is located at a side of the shift register away from the display region.

9. The display panel according to claim 2, further comprising:
scanning signal lines arranged in the display region and coupled to the output terminals of the shift registers; and
a connection line arranged in the non-display region and comprising: an end coupled to the output terminal of one of the shift registers and another end coupled to one of the scanning signal lines,
wherein the connection line is insulated from and intersects with the at least one driving signal line located between the shift registers and the display region.

10. The display panel according to claim 9, further comprising:
a substrate, and
a first metal layer, a second metal layer, and a third metal layer that are located at a side of the substrate and sequentially arranged in a direction away from the substrate,
wherein the driving signal lines are located in the third metal layer, and the connection line is located in the first metal layer.

11. The display panel according to claim 1,
wherein the shift registers comprise a scanning shift register and a light-emitting shift register,
wherein, in at least one of the scanning shift register or the light-emitting shift register, the output transistor is located at a side of the switch module away from the display region;
wherein, in a second direction intersecting with the first direction, the scanning shift register and the light-emitting shift register are located at two sides of the display region, respectively.

12. The display panel according to claim 1,
wherein the shift registers comprise a scanning shift register and a light-emitting shift register,
wherein, in a second direction intersecting with the first direction, the light-emitting shift register and the scanning shift register are located at a same side of the display region, and the light-emitting shift register is located at a side of the scanning shift register close to the display region; and
wherein, in the scanning shift register, the output transistor is located at a side of the switch module away from the display region.

13. The display panel according to claim 1, further comprising:
a substrate; and
an array layer and a display layer that are located at a side of the substrate,
wherein the shift registers are located in the array layer, and the display layer is located at a side of the array layer away from the substrate;
wherein the display layer comprises a first electrode layer comprising first electrodes that are patterned;
wherein the array layer comprises a semiconductor layer and a target metal layer, and in a direction perpendicular to a plane of the substrate, the target metal layer is a metal layer closest to the first electrode layer;
wherein the display panel further comprises at least one groove formed in the non-display region, and in the direction perpendicular to the plane of the substrate, the at least one groove penetrates through at least one insulating layer located between the semiconductor layer and the target metal layer; and
wherein the at least one groove is located at a side of the switch module away from the display region.

14. The display panel according to claim 13, wherein the at least one groove comprises a first groove, and the first groove penetrates through all insulating layers located between the semiconductor layer and the target metal layer.

15. The display panel according to claim 13,
wherein the array layer comprises a first insulating layer, and the first insulating layer is located at a side of the semiconductor layer away from the substrate and is in contact with the semiconductor layer; and
wherein the at least one groove comprises a second groove, and the second groove at least penetrates through the first insulating layer.

16. The display panel according to claim 13, wherein the at least one groove comprises a third groove and a fourth groove, and in the direction perpendicular to the plane of the substrate, the third groove and the fourth groove have different depths.

17. The display panel according to claim 13,
wherein the switch module comprises a switch transistor, and each of the switch transistor and the output transistor comprises a channel, and
wherein for one of the shift registers, a distance between the groove and the channel of the output transistor is smaller than a distance between the groove and the channel of the switch transistor.

18. The display panel according to claim 13, wherein the at least one groove comprises a plurality of grooves located in the non-display region, and in the first direction, at least one of the plurality of grooves is located between two adjacent shift registers of the shift registers.

19. The display panel according to claim 13, wherein the output transistor comprises a channel, wherein at least part of the at least one of groove overlaps with at least one of the channel of the output transistor in the first direction or the channel of the output transistor in a second direction intersecting with the first direction.

20. The display panel according to claim 13, wherein the at least one groove comprises a plurality of grooves located in the non-display region; and, in a second direction intersecting with the first direction, at least one of the plurality of grooves is located at a side of the output module away from the switch module.

21. The display panel according to claim 20, wherein at the side of the output module away from the switch module in the second direction, at least two grooves of the plurality of grooves are arranged along the first direction.

22. The display panel according to claim 13, wherein at least part of the at least one groove has a length in the first direction greater than a length in a second direction intersecting with the first direction.

23. The display panel according to claim 13,
wherein the shift registers comprise a scanning shift register and a light-emitting shift register,
wherein, in at least one of the scanning shift register or the light-emitting shift register, the output transistor is located at a side of the switch module away from the display region;
wherein, in a second direction intersecting with the first direction, the scanning shift register and the light-emitting shift register are located at a same side of the display region; and
wherein at least part of the at least one groove is located between the light-emitting shift register and the scanning shift register.

24. A display device, comprising a display panel,
wherein the display panel comprises:
a display region;
a non-display region;
shift registers cascaded and arranged along a first direction and located in the non-display region,
wherein a shift register of the shift registers comprises a switch module and an output module, the output module is coupled to an output terminal of the shift register and comprises only and exactly two output transistors, and the two output transistors comprise a first output transistor and a second output transistor that are located at a side of the switch module away from the display region,
wherein the display panel further comprises driving signal lines arranged in the non-display region, each driving signal line of the driving signal lines extends along the first direction, and the shift registers are coupled to the driving signal lines,
wherein a control electrode of the first output transistor is coupled to a first node, a first electrode of the first output transistor is coupled to one of the driving signal lines, and a second electrode of the first output transistor is coupled to the output terminal of the shift register; and a control electrode of the second output transistor is coupled to a second node that is not directly connected to the first node, a first electrode of the second output transistor is coupled to another one of the driving signal lines, and a second electrode of the second output transistor is coupled to the output terminal of the shift register.

* * * * *